United States Patent
Salazar et al.

(10) Patent No.: US 10,816,670 B2
(45) Date of Patent: Oct. 27, 2020

(54) NAVIGATION SATELLITE SYSTEM POSITIONING WITH ENHANCED SATELLITE-SPECIFIC CORRECTION INFORMATION

(71) Applicant: Trimble Inc., Sunnyvale, CA (US)

(72) Inventors: Dagoberto Salazar, Höhenkirchen-Siegertsbrunn (DE); Ulrich Weinbach, Höhenkirchen-Siegertsbrunn (DE); Timo Allison, Hampshire (GB)

(73) Assignee: Trimble Inc., Sunnyvale, CA (US)

( * ) Notice: Subject to any disclaimer, the term of this patent is extended or adjusted under 35 U.S.C. 154(b) by 254 days.

(21) Appl. No.: 15/985,196

(22) Filed: May 21, 2018

(65) Prior Publication Data
US 2018/0267171 A1 Sep. 20, 2018

Related U.S. Application Data

(63) Continuation of application No. 14/569,194, filed on Dec. 12, 2014, now Pat. No. 10,018,728.
(Continued)

(51) Int. Cl.
*G01S 19/13* (2010.01)
*G06F 17/10* (2006.01)
(Continued)

(52) U.S. Cl.
CPC .............. *G01S 19/13* (2013.01); *G01S 19/04* (2013.01); *G01S 19/07* (2013.01); *G01S 19/072* (2019.08);
(Continued)

(58) Field of Classification Search
CPC .......... G01S 19/13; G01S 19/43; G01S 19/42; G01S 19/07; G01S 19/04; G06F 30/00; G06F 17/10
(Continued)

(56) References Cited

U.S. PATENT DOCUMENTS

| | | | |
|---|---|---|---|
| 5,311,194 A | 5/1994 | Brown | |
| 5,323,322 A | 6/1994 | Mueller et al. | |

(Continued)

FOREIGN PATENT DOCUMENTS

| | | | |
|---|---|---|---|
| EP | 1 862 809 A1 | 12/2007 | |
| EP | 2 037 291 A1 | 3/2009 | |

(Continued)

OTHER PUBLICATIONS

Machine translation of Toshiba, JP2007-010422 (2007) (Year: 2007).*
(Continued)

*Primary Examiner* — Frank J McGue

(74) *Attorney, Agent, or Firm* — Kilpatrick Townsend & Stockton LLP

(57) ABSTRACT

The invention relates to methods, notably carried out by global or regional navigation satellite system (NSS) receivers, which involve receiving satellite-specific, nadir-angle dependent correction information associated with each of at least two NSS satellites among a plurality of NSS satellites. The correction information is useful to correct observed NSS signals, so as to mitigate the effects of satellite-specific, nadir-angle dependent biases in the NSS signals, and thus improve the performance of position determination systems. The invention also relates to methods for generating such correction information, to methods for designing a satellite, to NSS receivers, to apparatuses for generating correction information to be sent to the receivers, and to computer programs and storage mediums.

20 Claims, 14 Drawing Sheets

Related U.S. Application Data

(60) Provisional application No. 61/917,245, filed on Dec. 17, 2013.

(51) Int. Cl.
  *G01S 19/04* (2010.01)
  *G01S 19/07* (2010.01)
  *G01S 19/42* (2010.01)
  *G01S 19/43* (2010.01)
  *G06F 30/00* (2020.01)

(52) U.S. Cl.
  CPC .......... *G01S 19/073* (2019.08); *G01S 19/42* (2013.01); *G01S 19/43* (2013.01); *G06F 17/10* (2013.01); *G06F 30/00* (2020.01)

(58) Field of Classification Search
  USPC .................................................. 342/357.51
  See application file for complete search history.

(56) References Cited

U.S. PATENT DOCUMENTS

| | | |
|---|---|---|
| 5,828,336 A | 10/1998 | Yunck et al. |
| 5,893,044 A | 4/1999 | King et al. |
| 6,295,021 B1 | 9/2001 | Lichten et al. |
| 6,324,473 B1 | 11/2001 | Eschenbach |
| 6,662,107 B2 | 12/2003 | Gronemeyer |
| 7,117,417 B2 | 10/2006 | Sharpe et al. |
| 7,292,185 B2 | 11/2007 | Whitehead et al. |
| 7,312,747 B2 | 12/2007 | Vollath et al. |
| 7,432,853 B2 | 10/2008 | Vollath |
| 7,498,979 B2 | 3/2009 | Liu et al. |
| 7,538,721 B2 | 5/2009 | Vollath et al. |
| 7,541,975 B2 | 6/2009 | Sever et al. |
| 7,576,690 B2 | 8/2009 | Vollath |
| 7,589,668 B2 | 9/2009 | Vollath et al. |
| 7,692,578 B2 | 4/2010 | Vollath et al. |
| 7,746,272 B2 | 6/2010 | Vollath |
| 7,755,542 B2 | 7/2010 | Chen et al. |
| 7,768,449 B2 | 8/2010 | Gaal et al. |
| 7,868,820 B2 | 1/2011 | Kolb |
| 7,961,143 B2 | 6/2011 | Dai et al. |
| 7,982,667 B2 | 7/2011 | Vollath et al. |
| 8,018,377 B2 | 9/2011 | Collins |
| 8,035,552 B2 | 10/2011 | Dai et al. |
| 8,130,143 B2 | 3/2012 | Liu et al. |
| 8,237,609 B2 | 8/2012 | Talbot et al. |
| 8,242,953 B2 | 8/2012 | Dai et al. |
| 8,260,551 B2 | 9/2012 | Janky et al. |
| 8,334,807 B2 | 12/2012 | Gaal et al. |
| 8,368,590 B2 | 2/2013 | Vollath et al. |
| 8,368,591 B2 | 2/2013 | Talbot et al. |
| 8,400,351 B2 | 3/2013 | Talbot et al. |
| 8,542,146 B2 | 9/2013 | Vollath |
| 8,558,736 B2 | 10/2013 | Talbot et al. |
| 8,587,475 B2 | 11/2013 | Leandro |
| 8,614,642 B2 | 12/2013 | Talbot et al. |
| 8,694,250 B2 | 4/2014 | Talbot et al. |
| 8,704,708 B2 | 4/2014 | Vollath |
| 8,704,709 B2 | 4/2014 | Vollath et al. |
| 10,018,728 B2 | 7/2018 | Salazar et al. |
| 2003/0016147 A1 | 1/2003 | Evans |
| 2003/0048218 A1 | 3/2003 | Milnes et al. |
| 2005/0001763 A1 | 1/2005 | Han et al. |
| 2005/0055160 A1 | 3/2005 | King |
| 2005/0064878 A1 | 3/2005 | O'Meagher |
| 2005/0101248 A1 | 5/2005 | Vollath |
| 2007/0063894 A1 | 3/2007 | Yu |
| 2007/0200753 A1 | 8/2007 | Fuchs et al. |
| 2008/0036654 A1 | 2/2008 | Hansen et al. |
| 2008/0192242 A1 | 8/2008 | Nichols |
| 2008/0204312 A1 | 8/2008 | Euler |
| 2008/0238768 A1 | 10/2008 | Nasworthy |
| 2008/0258966 A1 | 10/2008 | Sugimoto et al. |
| 2009/0027264 A1 | 1/2009 | Chen et al. |
| 2009/0098880 A1 | 4/2009 | Lindquist |
| 2009/0109090 A1 | 4/2009 | Vollath |
| 2009/0135057 A1 | 5/2009 | Vollath et al. |
| 2009/0140914 A1 | 6/2009 | Talbot et al. |
| 2009/0179792 A1 | 7/2009 | Remondi |
| 2009/0179793 A1 | 7/2009 | Remondi |
| 2009/0184869 A1 | 7/2009 | Talbot et al. |
| 2009/0224969 A1 | 9/2009 | Kolb |
| 2009/0237298 A1 | 9/2009 | Vollath et al. |
| 2009/0322600 A1 | 12/2009 | Whitehead et al. |
| 2010/0033370 A1 | 2/2010 | Lopez et al. |
| 2010/0141515 A1 | 6/2010 | Doucet et al. |
| 2010/0156709 A1 | 6/2010 | Zhang et al. |
| 2010/0177806 A1 | 7/2010 | Normark et al. |
| 2010/0214162 A1 | 8/2010 | Talbot et al. |
| 2010/0245168 A1 | 9/2010 | Rollet et al. |
| 2010/0253575 A1 | 10/2010 | Vollath |
| 2011/0140959 A1 | 6/2011 | Vollath |
| 2011/0148698 A1 | 6/2011 | Vollath |
| 2011/0156949 A1 | 6/2011 | Vollath et al. |
| 2011/0187590 A1 | 8/2011 | Leandro |
| 2011/0267228 A1 | 11/2011 | Talbot et al. |
| 2011/0279314 A1 | 11/2011 | Talbot et al. |
| 2011/0285587 A1 | 11/2011 | Vollath et al. |
| 2012/0026038 A1 | 2/2012 | Vollath |
| 2012/0092213 A1 | 4/2012 | Chen |
| 2012/0119944 A1 | 5/2012 | Chen |
| 2012/0154210 A1 | 6/2012 | Landau et al. |
| 2012/0154214 A1 | 6/2012 | Leandro |
| 2012/0154215 A1 | 6/2012 | Vollath et al. |
| 2012/0162007 A1 | 6/2012 | Leandro et al. |
| 2012/0163419 A1 | 6/2012 | Seeger |
| 2012/0229332 A1 | 9/2012 | Vollath et al. |
| 2012/0286991 A1 | 11/2012 | Chen et al. |
| 2012/0293367 A1 | 11/2012 | Chen et al. |
| 2012/0306694 A1 | 12/2012 | Chen et al. |
| 2013/0044026 A1 | 2/2013 | Chen et al. |
| 2013/0335266 A1 | 12/2013 | Vollath et al. |
| 2014/0002300 A1 | 1/2014 | Leandro et al. |
| 2014/0015712 A1 | 1/2014 | Leandro et al. |

FOREIGN PATENT DOCUMENTS

| | | |
|---|---|---|
| JP | 2010 019728 A | 1/2010 |
| WO | 03/038464 A2 | 5/2003 |
| WO | 2005/043186 A2 | 5/2005 |
| WO | 2007/082038 A1 | 7/2007 |
| WO | 2010/042441 A1 | 4/2010 |
| WO | 2010/096159 A2 | 8/2010 |
| WO | 2011/034616 A2 | 3/2011 |

OTHER PUBLICATIONS

Goldstein, D., et al., "Request for Feedback on GPS IIR-20 (SVN-49) Mitigation Options," Global Positioning Systems Wing, Mar. 5, 2010, 21 pages. Downloaded from http:www.navcen/uscg.gov/pdf/gps/news/Mar2010_svn49/GPSW_SVN_49_inf_Brief_Mar_2010_Final.pdf.

Fay, G., et al., "Methodology for Modeling the SVN49 Anomaly for Static Scenarios," ION ITM 2011, 9 pages.

Intention to Grant for European Patent Application No. 14 198 217.3, dated Sep. 8, 2016, 118 pages.

Hofmann-Wellenhof B., et al., "GNSS, Global Navigation Satellite Systems, GPS, GLONASS, Galileo & more," Springer-Verlag Wien, 2008, 546 pages. Downloaded from https://nguyenduyliemgis.files.wordpress.com/2014/09/gnss-global-navigation-satellite-systems-gps-glonass-galileo-and-more-2008.pdf.

Sanz Subirana, J., et al., "GNSS Data Processing," vol. II: Laboratory Exercises, ESTEC, Noordwijk, The Netherlands: ESA Publications Division (ESA TM-23/2), May 2013, 344 pages. Downloaded from http://gage.upc.edu/sites/default/files/TEACHING_MATERIAL/GNSS_Book/ESA_GNSS-Book_TM-23_Vol_II.pdf.

D'Angelo, et al., "GNSS Bias Calibration Process and Results," Proceedings of the 26th International Technical Meeting of the ION Satellite Division, ION GNSS+ 2013, Nashville, Tennessee, Sep. 16-20, 2013, 7 pages.

(56) References Cited

OTHER PUBLICATIONS

European Search Report dated Oct. 5, 2015 for European Patent Application No. 14198217.3, 15 pages.
Partial European Search Report dated Jun. 2, 2015 for European Patent Application No. 14198217.3, 7 pages.
Nagarajoo K et al., "DGPS Positional Improvement by Mitigating the Ionospheric Horizontal Gradient and Elevation Angle Effects" Proceedings of 2010 Applied Electromagnetics (APACE), 2010 IEEE Asia-Pacific Conference on IEEE, Nov. 9, 2010, pp. 1-4.
Fairhurst P et al., "New Systems, New Signals, New Positions—Providing BeiDou Integration" GNSS 2013—Proceedings of the 26$^{th}$ International Technical Meeting of the Satellite Division of the Institute of Navigation, Manassas VA, Sep. 20, 2013, pp. 3214-3220.
International Search Report and Written Opinion of the International Searching Authority dated May 31, 2011 in International Application No. PCT/US2010/002565 (six pages).
International Search Report and Written Opinion of the International Searching Authority dated May 31, 2011 in International Application No. PCT/US2010/002564 (seven pages).
International Search Report and Written Opinion of the International Searching Authority dated May 30, 2011 in International Application No. PCT/US2010/002563 (six pages).
International Search Report and Written Opinion of the International Searching Authority dated May 26, 2011 in International Application No. PCT/US2010/002562 (six pages).
International Search Report and Written Opinion of the International Searching Authority dated May 31, 2011 in International Application No. PCT/US2010/002581 (six pages).
International Search Report and Written Opinion of the International Searching Authority dated Sep. 27, 2011 in International Application No. PCT/US2011/024733 (ten pages).
International Search Report and Written Opinion of the International Searching Authority dated Oct. 6, 2011 in International Application No. PCT/US2011/024743 (ten pages).
International Search Report and Written Opinion of the International Searching Authority dated Sep. 26, 2011 in International Application No. PCT/US2011/024763 (ten pages).
International Search Report and Written Opinion of the International Searching Authority dated Oct. 12, 2012 in International Application No. PCT/US2012/029694 (fourteen pages).
International Search Report and Written Opinion of the International Searching Authority dated Oct. 16, 2012 in International Application No. PCT/US2012/028670 (eight pages).
International Search Report and Written Opinion of the International Searching Authority dated Sep. 5, 2012 in International Application No. PCT/US2012/028671 (eight pages).
S. Banville et al., "Satellite and Receiver Phase Bias Calibration for Undifferenced Ambiguity Resolution," Proceedings of the 2008 National Technical Meeting of the Institute of Navigation, San Diego, CA, Jan. 2008, pp. 711-719.
Y. Bar-Sever et al., "A new model for GPS yaw attitude," Journal of Geodesy, vol. 70, No. 11, Nov. 1996, pp. 714-723 (abstract only).
G. Bierman, Factorization Methods for Discrete Sequential Estimation, Academic Press, Inc., 1977, 129 pp.
S. Bisnath et al., "Precise Orbit Determination of Low Earth Orbiters with GPS Point Positioning," Proceedings of the 2001 National Technical Meeting of the Institute of Navigation, Long Beach, CA, Jan. 2001, pp. 725-733.
P. Collins, "Isolating and Estimating Undifferenced GPS Integer Ambiguities," Proceedings of the 2008 National Technical Meeting of the Institute of Navigation, San Diego, CA, Jan. 2008, pp. 720-732.
P. Collins et al., "Precise Point Positioning with Ambiguity Resolution using the Decoupled Clock Model," Proceedings of the 21st International Technical Meeting of the Satellite Division of the Institute of Navigation (ION GNSS 2008), Savannah, GA, Sep. 2008, pp. 1315-1322.
P. Collins et al., "Accessing and Processing Real-Time GPS Corrections for Precise Point Positioning . . . Some User Considerations," Proceedings of the 18th International Technical Meeting of the Satellite Division of the Institute of Navigation (ION GNSS 2005), Long Beach, CA, Sep. 2005, pp. 1483-1491.
Y. Gao et al., "A New Method for Carrier-Phase-Based Precise Point Positioning", Navigation, Journal of the Institute of Navigation, vol. 49, No. 2, Summer 2002, pp. 109-116.
"GNSS Solutions: Precise Point Positioning and Its Challenges, Aided-GNSS and Signal Tracking," Inside GNSS, Nov./Dec. 2006, pp. 16-21.
M. Gabor et al., "Satellite-Satellite Single-Difference Phase Bias Calibration as Applied to Ambiguity Resolution", Navigation, Journal of the Institute of Navigation, vol. 49, No. 4, Winter 2002-2003, pp. 223-247.
M. Ge et al., "Resolution of GPS carrier-phase ambiguities in Precise Point Positioning (PPP) with daily observations," Journal of Geodesy, Jul. 2008, vol. 82, Issue 7, pp. 389-399.
A. Hauschild et al., "Real-time Clock Estimation for Precise Orbit Determination of LEO-Satellites," Proceedings of the 21st International Technical Meeting of the Satellite Division of the Institute of Navigation (ION GNSS 2008), Savannah, GA, Sep. 2008, pp. 581-589.
P. Heroux et al., "GPS Precise Point Positioning Using IGS Orbit Products," Phys. Chem. Earth (A), vol. 26, No. 6-8. pp. 573-578, 2001.
P. Heroux et al., "GPS Precise Point Positioning with a Difference," presented at Geomeatics '95, Ottawa, Ontario, Canada, Jun. 13-15, 1995, 11 pp.
S. Hutsell, "Relating the hadamard variance to MCS Kalman filter clock estimation," in Proceedings of the 27th Annual Precise Time and Time Interval (PTTI) Applications and Planning Meeting, p. 293, San Diego, Calif, USA, Dec. 1995.
IERS Conventions (2003), International Earth Rotation and Reference Systems Service, IERS Technical Note No. 32, 127 pp.
"IGS Product Table—updated for 2009," from http://igsch.jpl.nasa.gov/components/prods.html on Aug. 19, 2009, three pages.
J. Kouba, "A simplified yaw-attitude model for eclipsing GPS satellites," GPS Solutions, Jan. 2009, vol. 13, Issue 1, pp. 1-12.
J. Kouba, "A guide to using International GPS Service (IGS) Products," International GPS Service, Feb. 2003, 31 pp.
J. Kouba et al., "Precise Point Positioning Using IGS Orbit and Clock Products," GPS Solutions, Oct. 2001, vol. 5, Issue 2, pp. 12-28.
D. Lapucha et al., "Comparison of the Two Alternate Methods of Wide Area Carrier Phase Positioning," Proceedings of the 17th International Technical Meeting of the Satellite Division of the Institute of Navigation (ION GNSS 2004), Long Beach, CA, Sep. 2004, pp. 1864-1871.
D. Laurichesse et al., "Real Time Zero-difference Ambiguities Fixing and Absolute RTK," Proceedings of the 2008 National Technical Meeting of the Institute of Navigation, San Diego, CA, Jan. 2008, pp. 747-755.
D. Laurichesse et al., "Integer Ambiguity Resolution on Undifferenced GPS Phase Measurements and its Application to PPP," Proceedings of the 20th International Technical Meeting of the Satellite Division of the Institute of Navigation (ION GNSS 2007), Fort Worth, TX, Sep. 2007, pp. 839-848.
R. Leandro et al., "Wide Area Based Precise Point Positioning," Proceedings of the 19th International Technical Meeting of the Satellite Division of the Institute of Navigation (ION GNSS 2006), Fort Worth, TX, Sep. 2006, pp. 2272-2278.
R. Leandro et al., "UNB Neutral Atmosphere Models: Development and Performance," Proceedings of the 2006 National Technical Meeting of the Institute of Navigation, Monterey, CA, Jan. 2006, pp. 564-573.
S. Lo et al., "GNSS Album: Images and Spectral Signature of the New GNSS Signals," Inside GNSS, May/Jun. 2006, pp. 46-56.
W. Melbourne, "The case for ranging in GPS based geodetic systems," Proceedings 1st International Symposium on Precise Positioning with the Global Positioning system, U.S. Department of Commerce, Rockville, Maryland, Apr. 15-19, vol. 1, pp. 373-386.
L. Mervart et al., "Precise Point Positioning with Ambiguity Resolution in Real-Time," Proceedings of the 21st International Tech-

(56) References Cited

OTHER PUBLICATIONS nical Meeting of the Satellite Division of the Institute of Navigation (ION GNSS 2008), Savannah, GA, Sep. 2008, pp. 397-405.
Y. Mireault et al., "Online Precise Point Positioning," GPS World, Sep. 2008, pp. 59-64.
A. Niell, "Global mapping functions for the atmosphere delay at radio wavelengths," Journal of Geophysical Research, vol. 101, No. B2, pp. 3227-3246, Feb. 10, 1996.
S. Schaer, [IGSMAIL-287]: Monitoring (P1-C1) code biases, IGS Electronic Mail Message No. 2827,May 9, 2000, two pages.
G. Seeber, Satellite Geodesy, 2d. Ed., 2003, p. 31.
P. Tetrault et al., "CSRS-PPP: An Internet Service for GPS User Access to the Canadian Spatial Reference Frame," Geomatica, vol. 59, No. 1, 2005, pp. 17-28.
A. Van Dierendonck et al., "Relationship Between Allan Variances and Kalman Filter Parameters," Proceedings of the 16th Annual Precise Time and Time Interval (PTTI) Applications and Planning Meeting, NASA Goddard Space Flight Center, Nov. 1984, pp. 273-293.
S. Verhagen, "The GNSS integer ambiguities: estimation and validation" PhD dissertation, Delft University of Technology, Publications on Geodesy, vol. 58, Netherlands Geodetic Commission, Delft, 2005, 196 pp.
G. Wubbena, "Software Developments for Geodetic Positioning with GPS Using TI 4100 Code and Carrier Measurements," in Goad C.C. (ed), Proc. of First Int. Sym. on Precise Position. with GPS Rockville, Maryland, pp. 403-412, (1985).
J. Zumberge et al., "Precise point positioning for the efficient and robust analysis of GPS data from large networks," Journal of Geophysical Research: Solid Earth, vol. 102, Issue B3, pp. 5005-5017, Mar. 10, 1997.
Extended European Search Report dated Aug. 4, 2014 for European Patent Application 12761111.9, 8 pages.
D. Odijk, "Improving the Speed of CORS Network RTK Ambiguity Resolution" Position Location and Navigation Symposium (Plans), 2010 IEEE / ION, IEEE, Piscataway, NJ, May 4, 2010, pp. 79-84.
Horng-Yue Chen, "An Instantaneous Ambiguity Resolution Procedure Suitable for Medium-Scale GPS Reference Station Networks" GPS 2000—Proceedings of the 13th International Technical Meeting of the Satellite Division of the Institute of Navigation, Manassas, VA 20109, Sep. 22, 2000, pp. 1061-1070.
U.S. Appl. No. 14/569,194 Restriction Requirement dated May 25, 2017, 6 pages.
U.S. Appl. No. 14/569,194 Non-Final Office Action dated Aug. 18, 2017, 10 pages.
U.S. Appl. No. 14/569,194 Notice of Allowance dated Apr. 27, 2018, 8 pages.

\* cited by examiner

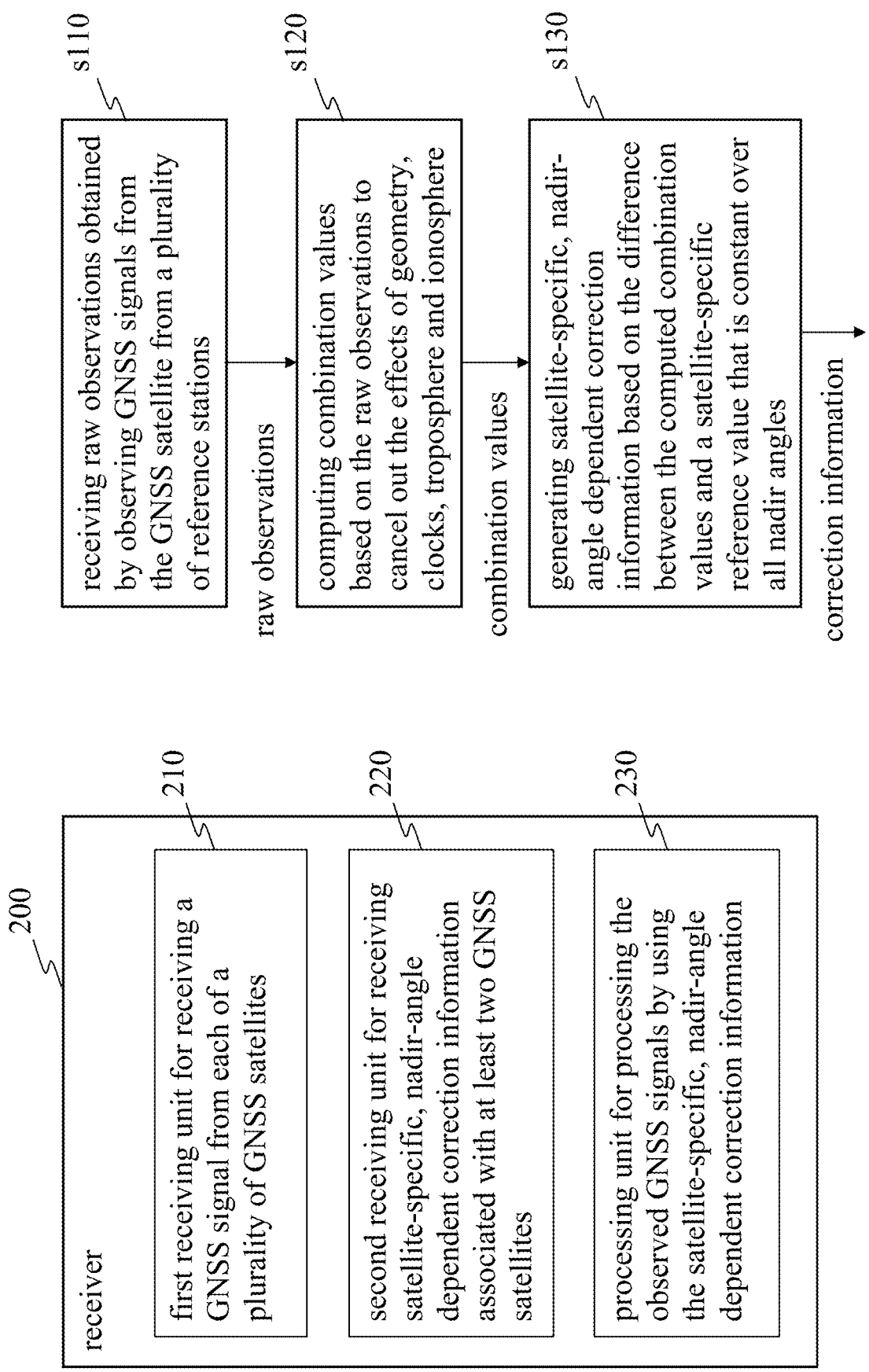

NAVIGATION SATELLITE SYSTEM POSITIONING WITH ENHANCED SATELLITE-SPECIFIC CORRECTION INFORMATION

CROSS-REFERENCE TO RELATED APPLICATIONS

This application is a continuation of U.S. application Ser. No. 14/569,194, filed Dec. 12, 2014, which claims priority to U.S. Provisional Application No. 61/917,245, filed Dec. 17, 2013, the entire contents of both of which are incorporated herein by reference in their entirety for all purposes.

FIELD OF TECHNOLOGY

The invention relates to global or regional navigation satellite systems (NSS) position estimation methods and devices. The fields of application of the methods and devices include, but are not limited to, navigation, map-making, land surveying, civil engineering, agriculture, disaster prevention and relief, and scientific research.

BACKGROUND

Navigation satellite systems (NSS) include both global navigation satellite systems (GNSS) and regional navigation satellite systems (RNSS), such as the Global Positioning System (GPS) (United States), GLONASS (Russia), Galileo (Europe), BeiDou (China), and the Indian Regional Navigational Satellite System (IRNSS) (systems in use or in development). A NSS typically uses a plurality of satellites orbiting the Earth. The plurality of satellites forms a constellation of satellites. A NSS receiver detects a code modulated on an electromagnetic signal broadcast by a satellite. The code is also called a ranging code. Code detection includes comparing the bit sequence modulated on the broadcasted signal with a receiver-side version of the code to be detected. Based on the detection of the time of arrival of the code for each of a series of the satellites, the NSS receiver estimates its position. Positioning includes, but is not limited to, geolocation, i.e. the positioning on the surface of the Earth.

An overview of GPS, GLONASS and Galileo is provided for instance in sections 9, 10 and 11 of Hofmann-Wellenhof B., et al., *GNSS, Global Navigation Satellite Systems, GPS, GLONASS, Galileo, & more*, Springer-Verlag Wien, 2008, (hereinafter referred to as "reference [1]").

Positioning using NSS signal codes provides a limited accuracy, notably due to the distortion the code is subject to upon transmission through the atmosphere. For instance, the GPS includes the transmission of a coarse/acquisition (C/A) code at 1575.45 MHz, the so-called L1 frequency. This code is freely available to the public, in comparison to the Precise (P) code, which is reserved for military applications. The accuracy of code-based positioning using the GPS C/A code is approximately 15 meters, when taking into account both the electronic uncertainty associated with the detection of the C/A code (electronic detection of the time of arrival of the pseudorandom code) and other errors including those caused by ionospheric and tropospheric effects, ephemeris errors, satellite clock errors and multipath propagation.

An alternative to positioning based on the detection of a code is positioning based on carrier phase measurements. In this alternative approach or additional approach (ranging codes and carrier phases can be used together for positioning), the carrier phase of the NSS signal transmitted from the NSS satellite is detected, not (or not only) the code modulated on the signal transmitted from the satellite.

The approach based on carrier phase measurements has the potential to provide much greater position precision, i.e. up to centimetre-level or even millimetre-level precision, compared to the code-based approach. The reason may be intuitively understood as follows. The code, such as the GPS C/A code on the L1 band, is much longer than one cycle of the carrier on which the code is modulated. The position resolution may therefore be viewed as greater for carrier phase detection than for code detection.

However, in the process of estimating the position based on carrier phase measurements, the carrier phases are ambiguous by an unknown number of cycles. The phase of a received signal can be determined, but the number of cycles cannot be directly determined in an unambiguous manner. This is the so-called "integer ambiguity problem", "integer ambiguity resolution problem" or "phase ambiguity resolution problem", which may be solved to yield the so-called fixed solution.

GNSS observation equations for code observations and for carrier phase observations are for instance provided in reference [1], section 5. An introduction to the GNSS integer ambiguity resolution problem, and its conventional solutions, is provided in reference [1], section 7.2. The skilled person will recognize that the same or similar principles apply to RNSS systems.

In order to improve the positioning process at the receivers, such as to improve the performance of position determination systems, some systems involve sending correction information to the receivers. Such correction information may generally be seen as comprising information useful to correct NSS observations made by a receiver. For example, the correction information may represent data relating to the NSS system that may be taken into account and used to improve the estimation of the receiver position. The correction information may comprise correction data relating to NSS satellites, such as, but not limited to, accurate orbital data and accurate satellite clock data to improve the positioning solution.

The correction information may be computed or prepared by a network of reference receivers with precisely known positions in a global reference frame (i.e., coordinate system). A typically world-wide network of reference receivers is used for GNSS systems, whereas a regional network of reference receivers is typically sufficient for RNSS systems. The data from the reference receivers is transmitted for example over the internet to a processing centre, where the data is collected, synchronized and processed. During the data processing, a variety of products can be generated, including e.g. satellite orbits, satellite clock errors, GNSS (or RNSS) measurement biases, and atmospheric effects. The products (or corrections) are then sent to the rover receivers on the field. The transmission to the rover can take place in many different forms, of which the most commonly used are the internet and satellite links. For a descriptive example of a global GNSS positioning correction service see e.g. WO 2011/034616 A2 (applicant reference: TNL A-2585PCT).

There is a constant need for improving the implementation of positioning systems based notably on GNSS (or RNSS) carrier phase measurements, to obtain a precise estimation of the receiver position.

SUMMARY

The present invention aims at meeting the above-mentioned needs. The invention includes methods and apparatuses as defined in the claims.

In one embodiment of the invention, a method is carried out by a NSS receiver (or, in an alternative, by a NSS receiver and a processing entity connected to the NSS receiver) to estimate parameters derived at least from NSS signals useful to determine a position. The method comprises the following steps. A NSS signal is observed from each of a plurality of NSS satellites. The method also comprises receiving correction information, hereinafter referred to as "satellite-specific, nadir-angle dependent correction information" or, for the sake of clarity, "satellite-specific-nadir-angle-dependent-correction-information", associated with each of at least two NSS satellites among the plurality of NSS satellites. The satellite-specific-nadir-angle-dependent-correction-information associated with a NSS satellite is useful to correct the observed NSS signals from the NSS satellite. Specifically, the satellite-specific-nadir-angle-dependent-correction-information associated with a NSS satellite comprises correction information depending on the nadir angle of a receiver as seen from the NSS satellite, so as to mitigate the effects of satellite-specific, nadir-angle dependent biases in the NSS signals transmitted from the NSS satellite. The observed NSS signals from the plurality of NSS satellites are then processed by making use of, i.e. based on, the satellite-specific-nadir-angle-dependent-correction-information.

The satellite-specific-nadir-angle-dependent-correction-information is received for each of at least two NSS satellites, such as for example for all available NSS satellites or for a set of selected NSS satellites. As will be apparent from the detailed description, rather than considering that nadir-angle dependent biases constitute an anomaly affecting an isolated, unhealthy satellite, to be eventually decommissioned due to this anomaly, the inventors have turned a problem upside down by assuming that the signals from a plurality of NSS satellites, possibly all NSS satellites, are affected by nadir-angle biases. In doing so, a problem has been turned into an opportunity to significantly improve the positioning capabilities of NSS receivers, and to provide relaxed requirements for designing NSS satellites.

While some embodiments of the invention relate, as explained above, to the use of correction information by NSS receivers, other embodiments of the invention relate to generating correction information to be used, later, by NSS receivers.

In one embodiment, a method is provided for generating satellite-specific-nadir-angle-dependent-correction-information, said correction information being associated with each of at least two NSS satellites among a plurality of NSS satellites. The satellite-specific, nadir-angle dependent correction associated with a NSS satellite comprises correction information depending on the nadir angle of a receiver as seen from the NSS satellite, and such correction information is useful to mitigate the effects of satellite-specific, nadir-angle dependent biases in the NSS signals transmitted from the NSS satellite. The method comprises, for each NSS satellite among the at least two NSS satellites: (i) receiving raw observations obtained by observing NSS signals from the NSS satellite from a plurality of reference stations; (ii) computing combination values based on the raw observations to cancel out the effects of the satellite motion relative to the reference stations (i.e., to cancel out the effects of what is known in the art as the "geometry"), the effects of the clocks (of both the receiver and the satellite), the effects of the troposphere, and the effects of the ionosphere; and (iii) generating satellite-specific-nadir-angle-dependent-correction-information based on the difference between the computed combination values and a satellite-specific reference value that is constant over all nadir angles.

The method provides an effective way to generate satellite-specific-nadir-angle-dependent-correction-information that may be sent to, and used by, NSS receivers to mitigate the effects of satellite-specific, nadir-angle dependent biases in the NSS signals transmitted from NSS satellites.

The invention also relates to NSS receivers configured to carry out the above-mentioned method to estimate parameters derived at least from NSS signals useful to determine a position. The invention further relates to apparatuses configured for carrying out the above-described method for generating satellite-specific-nadir-angle-dependent-correction-information. The invention also relates to systems comprising apparatuses for generating the above-mentioned correction information and receivers using said information.

Yet furthermore, the invention relates to methods for designing a NSS satellite or a sub-system thereof, as defined in the claims. Namely, the invention also relates, in one embodiment, to a method for designing, using a satellite design program, any one of a NSS satellite and a subsystem thereof, wherein the method comprises a step of making a design of the NSS satellite or the subsystem thereof respectively, in which, for at least one frequency, the delays of the signals radiated over different nadir angles of the radiation pattern of the satellite's antenna designed to be, in orbit, directed towards the Earth, are taken into account by the satellite design program to decide whether a design of a NSS satellite or of a subsystem thereof is acceptable.

The invention also relates, in some embodiments, to computer programs, computer program products, and storage mediums for storing such computer programs, comprising computer-executable instructions for carrying out, when executed on a computer such as a NSS receiver or on another apparatus, the above-mentioned methods.

BRIEF DESCRIPTION OF THE DRAWINGS

Embodiments of the present invention shall now be described, in conjunction with the appended drawings in which:

FIG. 3 schematically illustrates a NSS receiver in one embodiment of the invention;

FIG. 4 is a flowchart a method for generating satellite-specific-nadir-angle-dependent-correction-information, in one embodiment of the invention;

DETAILED DESCRIPTION

Figure 2:
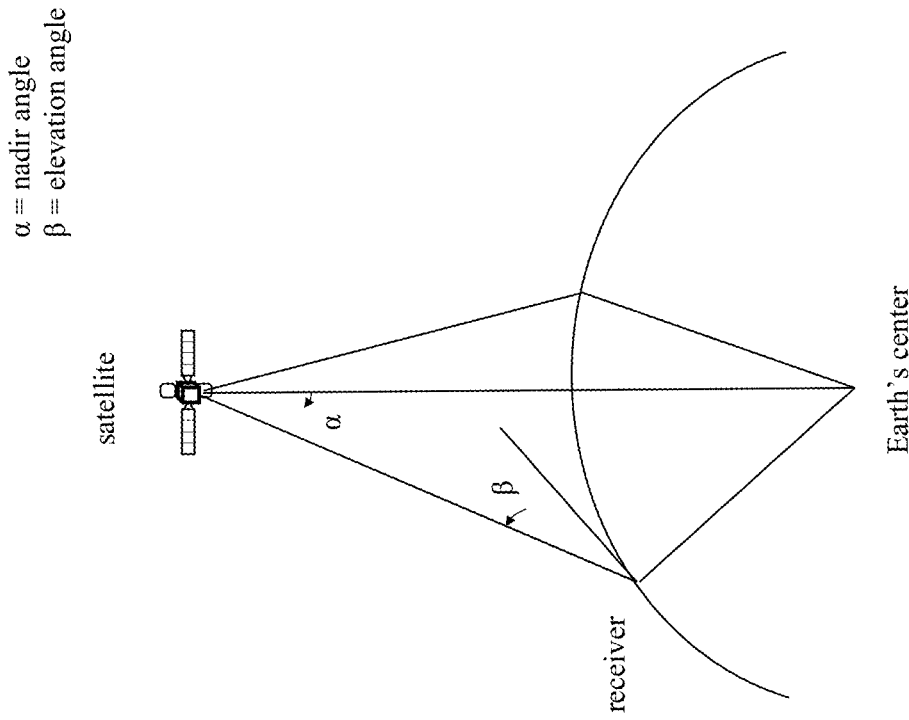
FIG. 2 schematically illustrates a satellite orbiting the Earth, as well as a NSS receiver on Earth, to illustrate the concepts of nadir angle and elevation angle.

The present invention shall now be described in conjunction with specific embodiments. The specific embodiments serve to provide the skilled person with a better understanding, but are not intended to in any way restrict the scope of the invention, which is defined by appended claims. In particular, the embodiments described independently throughout the description can be combined to form further embodiments to the extent that they are not mutually exclusive.

Throughout the following detailed description, and in the drawings, the abbreviation "GNSS" is used. The invention is, however, not limited to global navigation satellite systems (GNSS) but also applies to regional navigation satellite systems (RNSS). Thus, it is to be understood that each occurrence of "GNSS" in the following can be replaced by "RNSS" to form additional embodiments of the invention.

Figure 1:
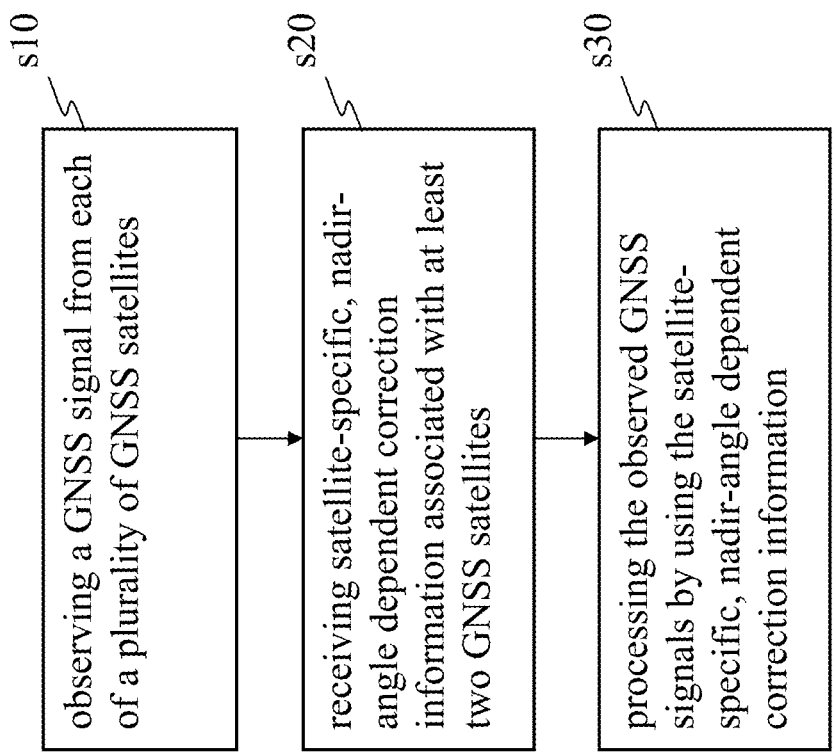
FIG. 1 is a flowchart a method according to one embodiment of the invention, wherein the method is carried out by a NSS receiver, or, in an alternative, by a NSS receiver and a processing entity connected thereto.

The flowchart of FIG. 1 illustrates a method in one embodiment of the invention. In this embodiment, the method serves to estimate parameters which are derived at least from global navigation satellite system (GNSS) signals and which are useful to determine a position, such as the position of a rover receiver or reference station. The method may eventually lead to determining or estimating the rover position or reference station position.

The method involves the use of correction information in the positioning process and, in particular, comprises the following steps.

In step s10, a GNSS signal is observed from each of a plurality of GNSS satellites. The receiver may receive at least one GNSS signal from each of a plurality of GNSS satellites by observing the ranging codes carried on a particular frequency by each of the plurality of GNSS satellites, or by observing the phase of the carrier emitted on a particular frequency by each of the plurality of GNSS satellites, or by observing both the ranging codes and the carrier phases.

In step s20, the receiver receives correction information, which is herewith called "satellite-specific-nadir-angle-dependent-correction-information". The satellite-specific-nadir-angle-dependent-correction-information is associated with each of at least two GNSS satellites among the plurality of GNSS satellites. In particular, the satellite-specific-nadir-angle-dependent-correction-information associated with a GNSS satellite is useful to correct the observed GNSS signals from the GNSS satellite. The satellite-specific-nadir-angle-dependent-correction-information associated with a GNSS satellite comprises correction information, such as for example correction coefficients, which depends on the nadir angle of a receiver as seen from the GNSS satellite. The correction information can be used to mitigate the effects of satellite-specific, nadir-angle dependent biases in the GNSS signals received from the GNSS satellite. The satellite-specific-nadir-angle-dependent-correction-information may for example be broadcast and received through a wired or wireless network (such as the internet) or via a satellite link.

The correction information may be in the form of, but not limited to, a calibration table or a polynomial expression. A calibration table is particularly advantageous as it does not require any assumption as to whether the nadir-angle dependent biases are following any specific pattern.

In step s30, the receiver processes the observed GNSS signals from the plurality of GNSS satellites by making use of, i.e. based on, the received satellite-specific-nadir-angle-dependent-correction-information. In particular, GNSS signals at different frequencies, from different GNSS satellites may be combined to ultimately compute the position of the receiver. Step s30 is known in the art except for the use of the satellite-specific-nadir-angle-dependent-correction-information in the positioning process, in order to correct the observations or data derived therefrom.

Based on the outcome of processing step s30, parameters are estimated, which are useful to determine or estimate a position, such as the position of a rover (or reference station) or more specifically the position of the antenna thereof. For instance, the estimated parameters may indicate the most probable number of cycles along a carrier separating a GNSS satellite from the GNSS receiver, i.e. the estimated parameters may be the resolved integer ambiguity. In other words, the output of the method need not be the position itself but parameters that may be used, for instance by another entity (such as a processing entity on a server dedicated to such task), to estimate or determine the rover position (or the position of a reference station).

The method may be performed by the receiver itself or by another processing entity remotely located from, but connect to, the receiver. The receiver may send data representing the GNSS observations to the processing entity which is then in charge of receiving the satellite-specific-nadir-angle-dependent-correction-information (step s20) and processing the observed signals based on, i.e. by making use of, the received correction information (step s30).

The method illustrated by FIG. 1 is advantageous in that it leads to an improved precise positioning. Observations from GNSS satellites that could not be used due to nadir-angle biases can now be used in the positioning process, and observations from GNSS satellites that could be used despite including nadir-angle biases can now be corrected before being used in the positioning process.

Further, in the method of FIG. 1, satellite-specific-nadir-angle-dependent-correction-information is provided to a receiver for more than one satellite. This means that nadir-angle dependent biases are not regarded as a phenomenon affecting an isolated, unhealthy satellite (to be eventually decommissioned), but the nadir-angle dependent biases are regarded as an opportunity to improve the positioning process for a plurality of satellites. To that end, correction information is generated and integrated in the positioning process.

FIG. 2 schematically illustrates a satellite orbiting the Earth and a receiver on or near the Earth's surface. The nadir angle, referred to by the Greek letter a (alpha), is the angle formed by the (imaginary) line from the satellite to the Earth's centre and the (imaginary) line from the satellite to the receiver. The elevation angle, referred to by the Greek letter 13 (beta), is the elevation angle of the satellite with reference to the horizon, as seen from the receiver.

A skilled person will therefore recognize that any reference to the nadir angle within the context of the present invention, and therefore within the present document, can be translated into a reference to an elevation angle. The elevation angle is usually taken when the receiver's perspective is chosen, whereas the nadir angle is more suitable when the satellite's perspective is taken. To explain the possible cause of the satellite-specific, elevation- or nadir-angle biases, the inventors have chosen to take the satellite's perspective, and therefore to talk about the nadir-angle dependence rather than the elevation-angle dependence. Although this approach is counter-intuitive since the purpose of the method is to estimate the position of the receiver, the approach helps to better understand the invention.

In one embodiment, the method uses carrier phase and pseudorange measurements of the GNSS signals and the candidate sets of integer ambiguities are processed to estimate parameters useful to determine the position.

In one embodiment, the method relates to an absolute positioning process rather than a relative positioning process.

In one embodiment, the satellite-specific-nadir-angle-dependent-correction-information associated with the at least two GNSS satellites comprises frequency-specific correction information. This embodiment is advantageous in that it has been observed that, for a GNSS satellite, the nadir angle biases may depend on the frequency of the GNSS signal under consideration.

In one embodiment, the satellite-specific-nadir-angle-dependent-correction-information comprises correction information associated with each of the plurality of GNSS satellites.

In one embodiment, the satellite-specific-nadir-angle-dependent-correction-information comprises correction information associated with at least one BeiDou GNSS satellite. The correction information may also comprise, in one embodiment, correction information associated with a majority of the operational BeiDou GNSS satellites or, in another embodiment, correction information associated with all operational BeiDou GNSS satellites. These embodiments are particularly advantageous in that it has been observed that, for at least some BeiDou satellites, the nadir angle biases are comparatively high, to the point of making it impossible, or at least very difficult, to use observe signals from such satellites in a precise point positioning system with ambiguity resolution. The invention is, however, in some embodiments, not limited to BeiDou satellites, and may be applied to any GNSS satellites, including current and future satellites.

In one embodiment, the satellite-specific-nadir-angle-dependent-correction-information comprises correction information associated with all frequencies involved in the estimation of the receiver position.

In another embodiment, the satellite-specific-nadir-angle-dependent-correction-information comprises correction information associated with one frequency involved in the estimation of the receiver position.

In yet another embodiment, the satellite-specific-nadir-angle-dependent-correction-information comprises correction information associated with a plurality of, but not all, frequencies involved in the estimation of the receiver position. The correction information may for example be associated with two frequencies among three available frequencies.

FIG. 3 schematically illustrates an apparatus in one embodiment of the invention. The apparatus is a receiver 200, which may for example be integrated in a rover. Receiver 200 comprises a so-called first receiving unit 210, a so-called second receiving unit 220, and a so-called processing unit 230. First receiving unit 210 is configured for receiving a GNSS signal from each of a plurality of GNSS satellites. Second receiving unit 220 is configured for receiving satellite-specific-nadir-angle-dependent-correction-information, associated with at least two GNSS satellites. Processing unit 230 is configured for processing the observed GNSS signals by making use of, i.e. based on, the satellite-specific-nadir-angle-dependent-correction-information. Receiver 200 may further comprise means (not illustrated in FIG. 3) for determining the receiver's position (or the receiver antenna's position) based on the output of processing unit 230.

While first receiving unit 210 is hosted in receiver 200, second receiving unit 220 and processing unit 230 may be hosted on an apparatus located remotely from, but connected to, receiver 200. In other words, second receiving unit 220 and processing unit 230 need not be hosted on receiver 200.

FIG. 4 is a flowchart of a method in one embodiment of the invention, for computing satellite-specific-nadir-angle-dependent-correction-information, such as for example correction coefficients. The method is for example carried out by means of a computer program executed on a computer, or a set of computers. The method is conducted for example in an office computer and need not be conducted in real-time. The purpose of the method is to generate satellite-specific-nadir-angle-dependent-correction-information associated with each of at least two GNSS satellites among a plurality of GNSS satellites. After generating the correction information, the correction information may be transmitted to a receiver, such as for example receiver 200 schematically illustrated in FIG. 3. The correction information may be regenerated from time to time, such as following the launch of one or more new GNSS satellites, or to accommodate changes of the satellite-specific-nadir-angle-dependent-correction-information over the lifetime of a GNSS satellite. In other words, the correction information may be generated periodically (such as for example every month, every two months, every three months, or every six months) and/or in response to particular events. The correction information may alternatively be generated continuously, based for example on the raw observations obtained during the last 15 days (or any other period of time).

The method of FIG. 4 comprises a step s110 of receiving raw observations obtained by observing, by a plurality of reference stations, GNSS signals (for example, over a plurality of consecutive days) transmitted from the at least two GNSS satellites. In other words, GNSS signals are observed by a plurality of reference stations, and raw observations are obtained in such a manner. In that respect, a wide data set, such as for example observations from 60 reference stations over 20 days, is preferred. Taking a wide data set helps reducing the local effects, such as for example multipath effects. In one sub-embodiment, raw observations from more than 15 reference stations over more than 15 days are obtained. In another sub-embodiment, raw observations from more than 30 reference stations over more than 10 days are obtained. In yet another sub-embodiment, raw observations from more than 45 reference stations over more than 5 days are obtained.

The raw observations are then used to compute, in step s120, combination values to cancel out the effects of the satellite motion relative to the reference stations (i.e. the effects of the geometry), the effects of the clocks, the effects of the troposphere and the effects of the ionosphere.

The satellite-specific-nadir-angle-dependent-correction-information is then generated s130 based on the difference between the computed combination values and a satellite-specific reference value that is constant over all nadir angles, especially all operational nadir angles (i.e., those for which the signals reach the Earth's surface or, in other words, for which the satellite is visible from a receiver on Earth or near the Earth's surface in the sense that the phase lock is not lost). It will be apparent from the description below how this satellite-specific reference value that is constant over all nadir angles may be selected. In general, it can be said that the satellite-specific reference value that is constant over all nadir angles should preferably be selected in such a way that the data matching the reference value is characterized by a low noise and a relatively large quantity of observed data. In other words, the nadir angle(s) for which the computed combination values match the constant reference value should not be too small, or the satellite may not be visible from many reference stations, and not too large as the observations become noisier as the multipath effects increase.

The generated satellite-specific-nadir-angle-dependent-correction-information is relative rather than absolute. Indeed, the correction information is relative to the bias at the selected reference angle. The method of FIG. 4 is not concerned with computing absolute satellite-specific-nadir-angle-dependent-correction-information, but relative satellite-specific-nadir-angle-dependent-correction-information.

In one embodiment, the correction information is not only generated per satellite, but also per frequency and per arc (range) of nadir angles.

In one embodiment, the satellite-specific-nadir-angle-dependent-correction-information is generated, and broadcast to the receivers, every month. In other embodiments, the correction information is generated and broadcast every day, every week, or every two months.

In one embodiment (not illustrated in the drawings), step s120 of computing combination values comprises computing multipath combination values based on the raw observations to cancel out the effects of the satellite motion relative to the reference stations (i.e. the effects of the geometry), the effects of the clocks, the effects of the troposphere, and the effects of the ionosphere.

In one embodiment (not illustrated in the drawings), step s120 of computing combination values comprises computing Melbourne-Wübbena combination values based on the raw observations to cancel out the effects of the satellite motion relative to the reference stations (i.e., the effects of the geometry), the effects of the clocks, the effects of the troposphere, and the effects of the ionosphere.

In one embodiment (not illustrated in the drawings), step s120 of computing combination values comprises computing ionosphere-free pseudorange-carrier phase (PC-LC) combination values based on the raw observations to cancel out the effects of the satellite motion relative to the reference station (i.e. the effects of the geometry), the effects of the clocks, the effects of the troposphere, and the effects of the ionosphere.

In one embodiment (not illustrated in the drawings), step s120 of computing combination values comprises computing the geometry-free, also called "ionospheric", pseudorange-carrier phase combinations based on the raw observations to cancel out the effects of the satellite motion relative to the reference stations (i.e. the effects of the geometry), the effects of the clocks, and the effects of the troposphere. Another information source is used to cancel out the effects of the ionosphere. This other information source used to cancel out the effects of the ionosphere may for example be, or comprise, an ionospheric map.

Figure 5:
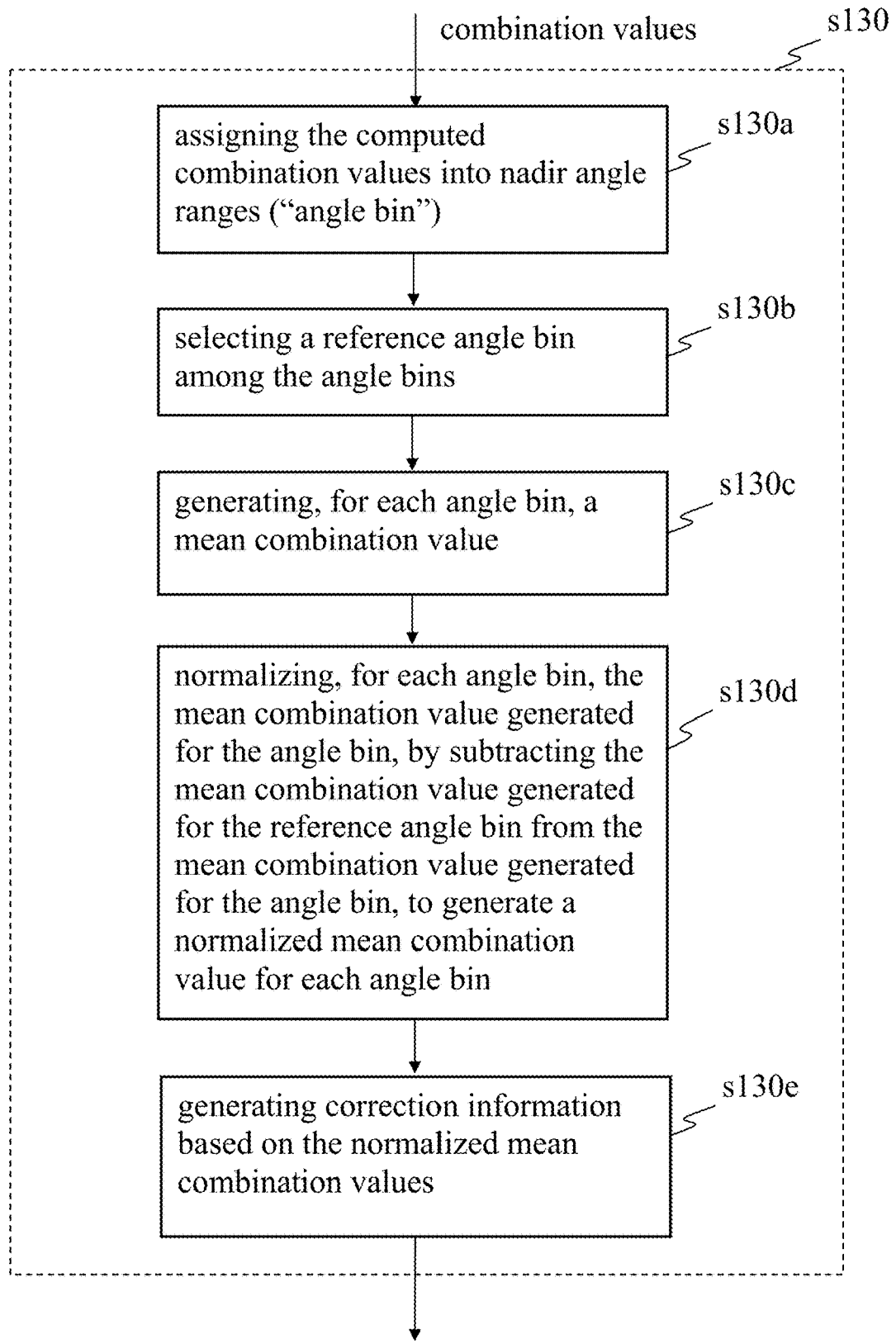
FIG. 5 is a flowchart of a portion of a method for generating satellite-specific-nadir-angle-dependent-correction-information, in one embodiment of the invention.

Let us now turn to FIG. 5, which is a flowchart of one embodiment of step s130 of generating satellite-specific-nadir-angle-dependent-correction-information.

Figure 14:
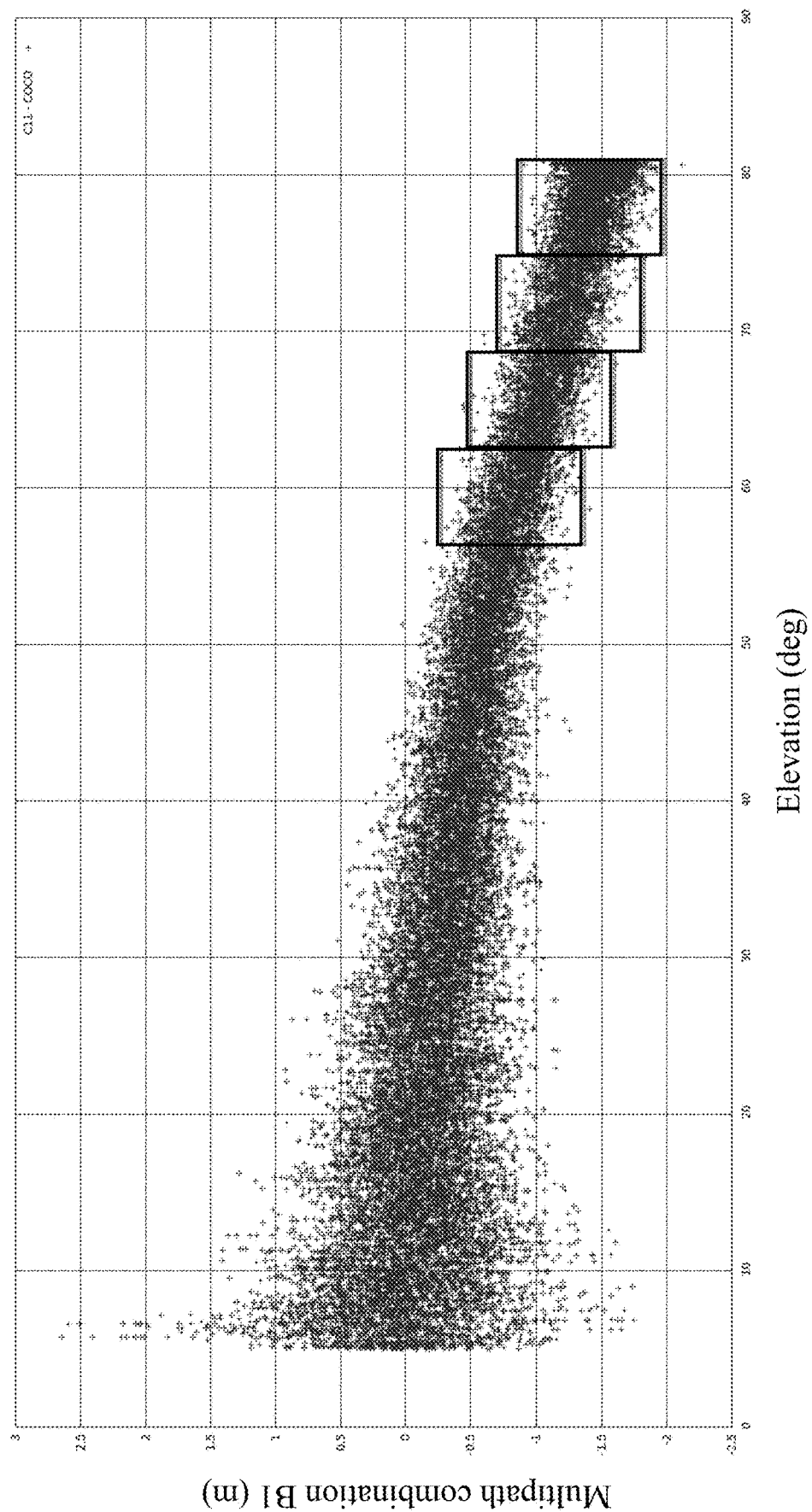
FIG. 14 schematically illustrates how computed combination values may be assigned into angle bins in one embodiment of the invention.

First, the computed combination values are assigned s130a into a plurality of nadir-angle ranges. Each of these nadir-angle ranges is hereinafter referred to as an "angle bin". FIG. 14 shows four exemplary angle bins. The angle bin data collection is performed per frequency and per satellite.

A reference angle bin is then selected s130b among the angle bins. As mentioned above, a reference angle bin with low noise (relative to the other angle bins) and a large quantity of data (relative to the other angle bins) is preferred to improve the quality of the resulting correction information. For example, a reference angle bin around 2.5 degrees may constitute a suitable trade-off between the requirement to select low noise data and the requirement to have a relatively large quantity of data. Reference angle bins other than around 2.5 degrees may however be selected based on the available data.

For each angle bin, a mean combination value is then generated s130c, by taking the average of all the computed combination values that are associated with nadir angles that fall within said angle bin. The mean combination value generated for the reference angle bin is the satellite-specific reference value that is constant over all nadir angles, as mentioned above with reference to FIG. 4.

Then, for each angle bin, the mean combination value generated for the angle bin is normalized s130d by subtracting the mean combination value generated for the reference angle bin from the mean combination value generated for the angle bin under consideration. In such a manner, a normalized mean combination value is generated for each angle bin.

The correction information is then generated s130e based on the normalized mean combination values.

In one embodiment (not illustrated in the drawings), the satellite-specific-nadir-angle-dependent-correction-information is generated s130 in the form of at least one calibration table which may be sent to a plurality of GNSS receivers. Instead of generating a calibration table, the correction information may also be in the form of coefficients for a polynomial expression, where the coefficients are to be sent to a plurality of GNSS receivers.

Figure 6:
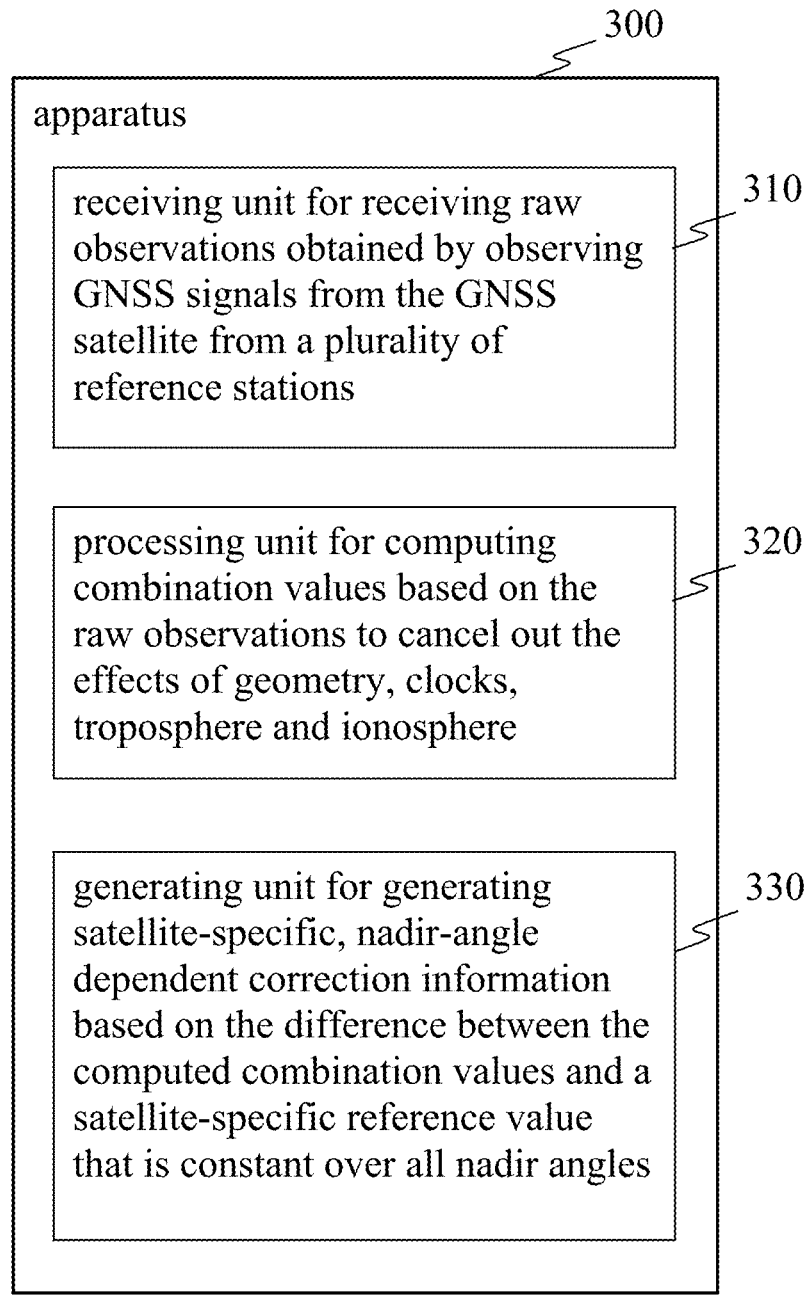
FIG. 6 schematically illustrates an apparatus configured for generating satellite-specific-nadir-angle-dependent-correction-information, in accordance with one embodiment of the invention.

FIG. 6 schematically illustrates an apparatus 300 configured for generating satellite-specific-nadir-angle-dependent-correction-information, in accordance with one embodiment of the invention. The correction information is associated with each of at least two GNSS satellites among a plurality of GNSS satellites. Apparatus 300 comprises a so-called receiving unit 310, a so-called processing unit 320, and a so-called generating unit 330.

Receiving unit 310 is configured for, for each GNSS satellite among the at least two GNSS satellites, receiving raw observations obtained by observing GNSS signals from the GNSS satellite from a plurality of reference stations.

Processing unit 320 is configured for, for each GNSS satellite among the at least two GNSS satellites, computing combination values based on the raw observations to cancel out the effects of the satellite motion relative to the reference stations (i.e., the effects of the geometry), the effects of the clocks, the effects of the troposphere and the effects of the ionosphere.

Generating unit 330 is configured for, for each GNSS satellite among the at least two GNSS satellites, generating satellite-specific-nadir-angle-dependent-correction-information based on the difference between the computed combination values and a satellite-specific reference value that is constant over all nadir angles.

The apparatus of FIG. 6 and the network used to broadcast the correction information are typically operated as a service to rover operators, while the network operator is typically a different entity than the rover operator.

Figure 7:
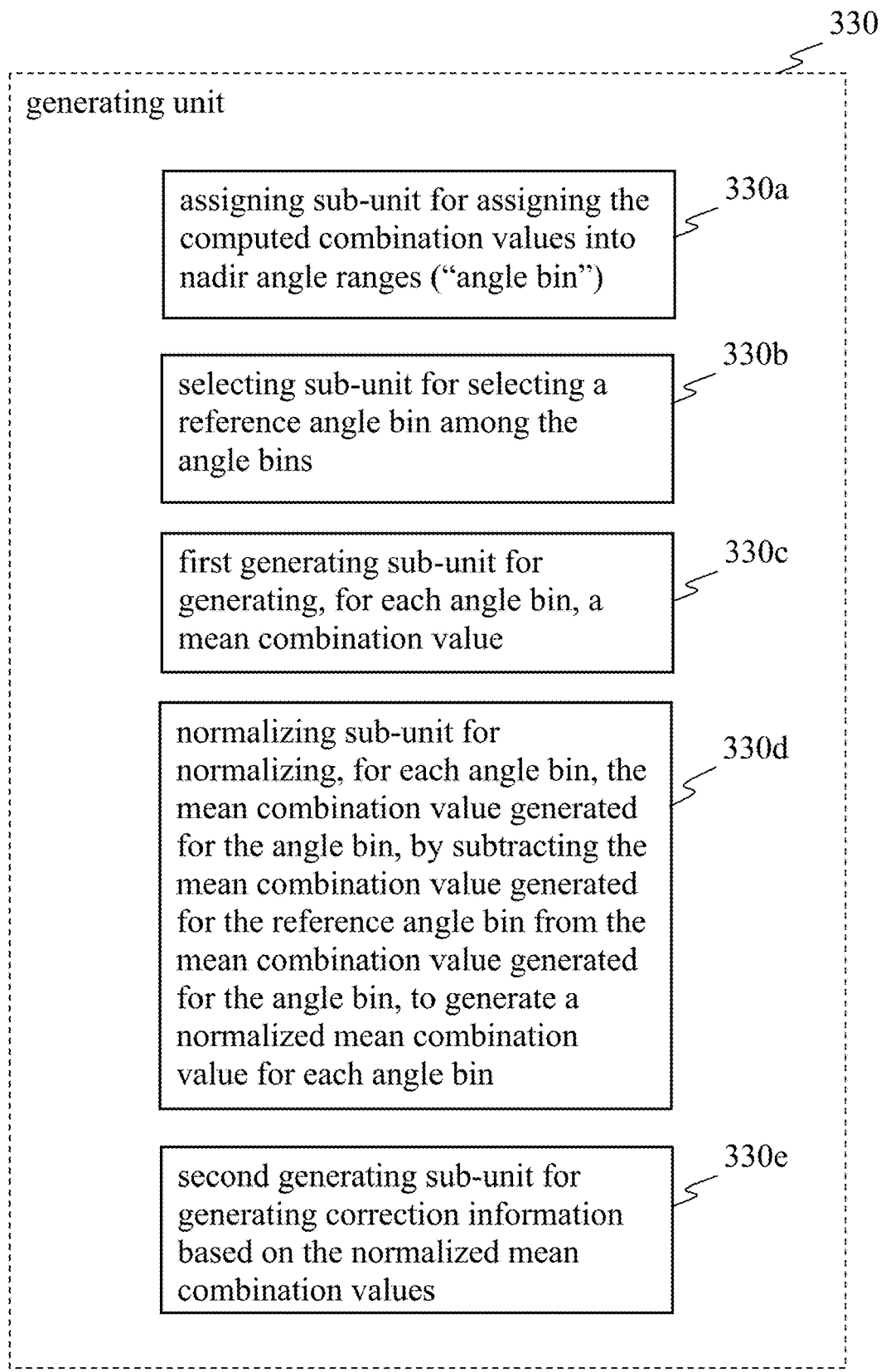
FIG. 7 schematically illustrates a portion, namely a so-called generating unit, of an apparatus configured for generating satellite-specific-nadir-angle-dependent-correction-information, in accordance with one embodiment of the invention.

FIG. 7 schematically illustrates a generating unit 330 (as described above with reference to FIG. 6) in one embodiment of the invention.

Generating unit 330 comprises (i) a so-called assigning sub-unit 330a configured for assigning the computed combination values into a plurality of nadir angle ranges, each nadir angle range being hereinafter referred to as an "angle bin"; (ii) a so-called selecting sub-unit 330b configured for selecting a reference angle bin among the angle bins; (iii) a so-called first generating sub-unit 330c configured for generating, for each angle bin, a mean combination value by taking the average of all the computed combination values that are associated with nadir angles that fall within said angle bin, wherein the mean combination value generated for the reference angle bin is the satellite-specific reference value that is constant over all nadir angles; (iv) a so-called normalizing sub-unit 330d configured for normalizing, for each angle bin, the mean combination value generated for the angle bin, by subtracting the mean combination value generated for the reference angle bin from the mean combination value generated for the angle bin, to generate a normalized mean combination value for each angle bin; and (v) a so-called second generating sub-unit 330e configured for generating correction information based on the normalized mean combination values.

Let us now further explain the context in which some embodiments of the invention have been developed, for a better understanding thereof. Further embodiments of the invention are also described.

During the inventors' research to adapt an existing GNSS positioning system to take into account BeiDou data, it was found out that it was very difficult to get any meaningful result at all, from such satellites. A closer examination of the input data (i.e., the raw observations) led to the finding that, for a given BeiDou satellite, the difference of the ionosphere-free pseudorange (PC) and phase (LC) combinations, i.e., PC-LC, showed a distinct, unexpected angle-dependent pattern instead of the noisy but constant-average output signal that is expected according to conventional GNSS theory. In other words, the dependency on the viewing angle was not expected according to the prior art GNSS models. These models assume that the satellite biases are common for all the GNSS receivers observing a given satellite.

When the value of the biases depend on the GNSS receiver (i.e., if an angle-dependency exists) to an extent comparable with the measurement noise level, the effects on the pseudoranges will affect the "precise point positioning with ambiguity fixing" approach, which uses the Melbourne-Wübenna (MW) combination of observations, and which also includes pseudoranges. Therefore, when the angle dependency affects the pseudoranges, the MW combination is adversely affected, and the carrier-phase ambiguity-fixing process as a whole is impaired. This is the case for at least some, and probably all satellites of the BeiDou constellation: the angle-dependent bias variations significantly exceed this measurement noise threshold.

In other words, if this bias angle-dependency effect was not properly mitigated, it would be impossible, or at least very difficult, to carry out a "precise point positioning with ambiguity fixing" method with the BeiDou satellites, and therefore those satellites could not be integrated within such a positioning system (with the currently guaranteed quality levels). Some embodiments of the invention address these problems.

However, the problem is not limited to satellites from the BeiDou constellation. Other GNSS satellites (in use or future) may exhibit this behaviour. As GNSS positioning systems are improved and the signal noise levels are reduced, taking into account bias angle-dependencies will play an ever increasing role (in the light of the angle-dependency-to-signal-noise ratio) in the improvement of the performance of precise positioning products.

FIGS. 8 to 13 illustrate the problematic phenomenon that some embodiments of the invention address.

Figure 8:
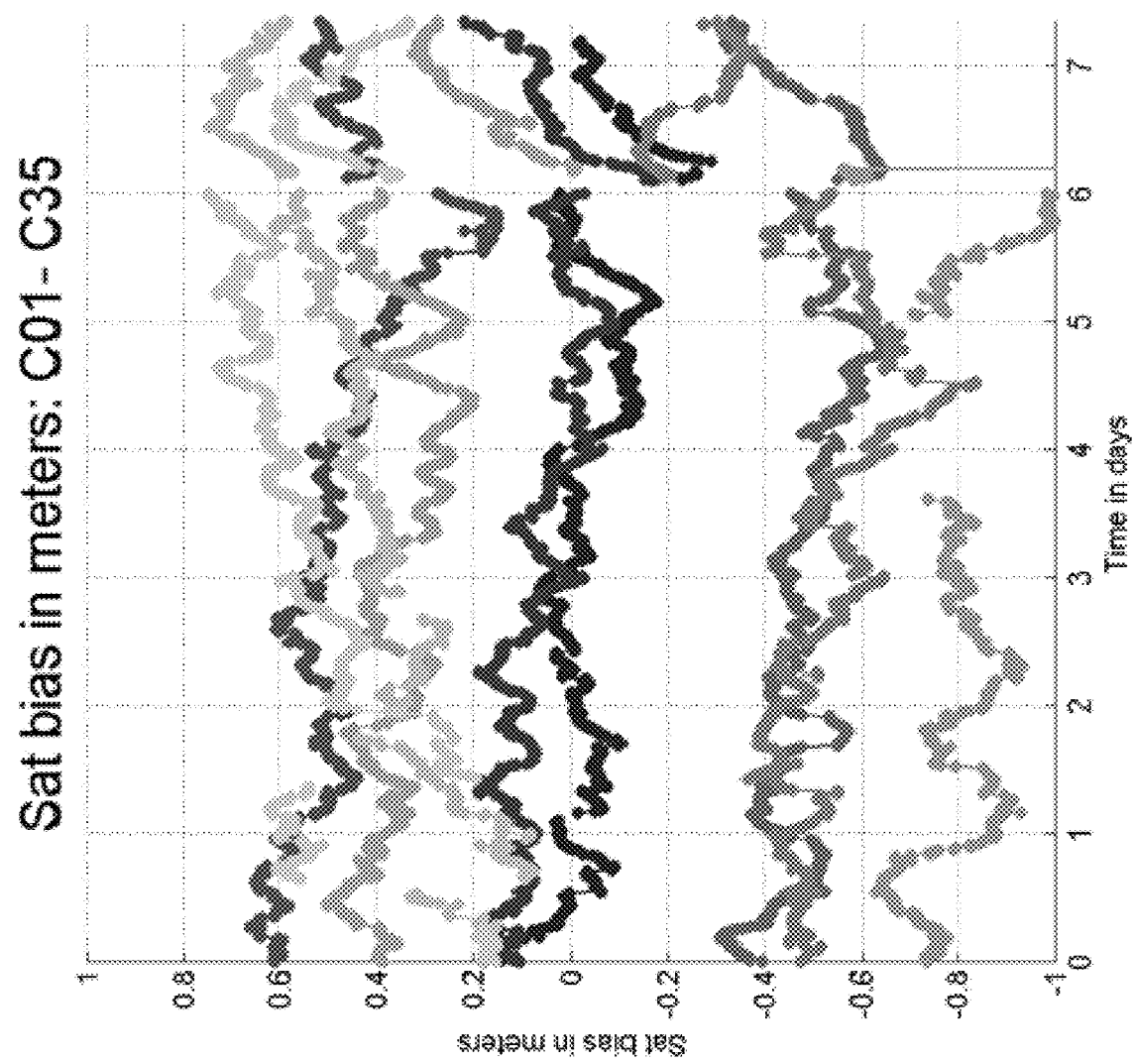
FIG. 8 shows the observed satellite wide-lane biases, in meters, in the signals transmitted by some BeiDou satellites (among satellites C01 to C35) over a period of one week.
Figure 9:
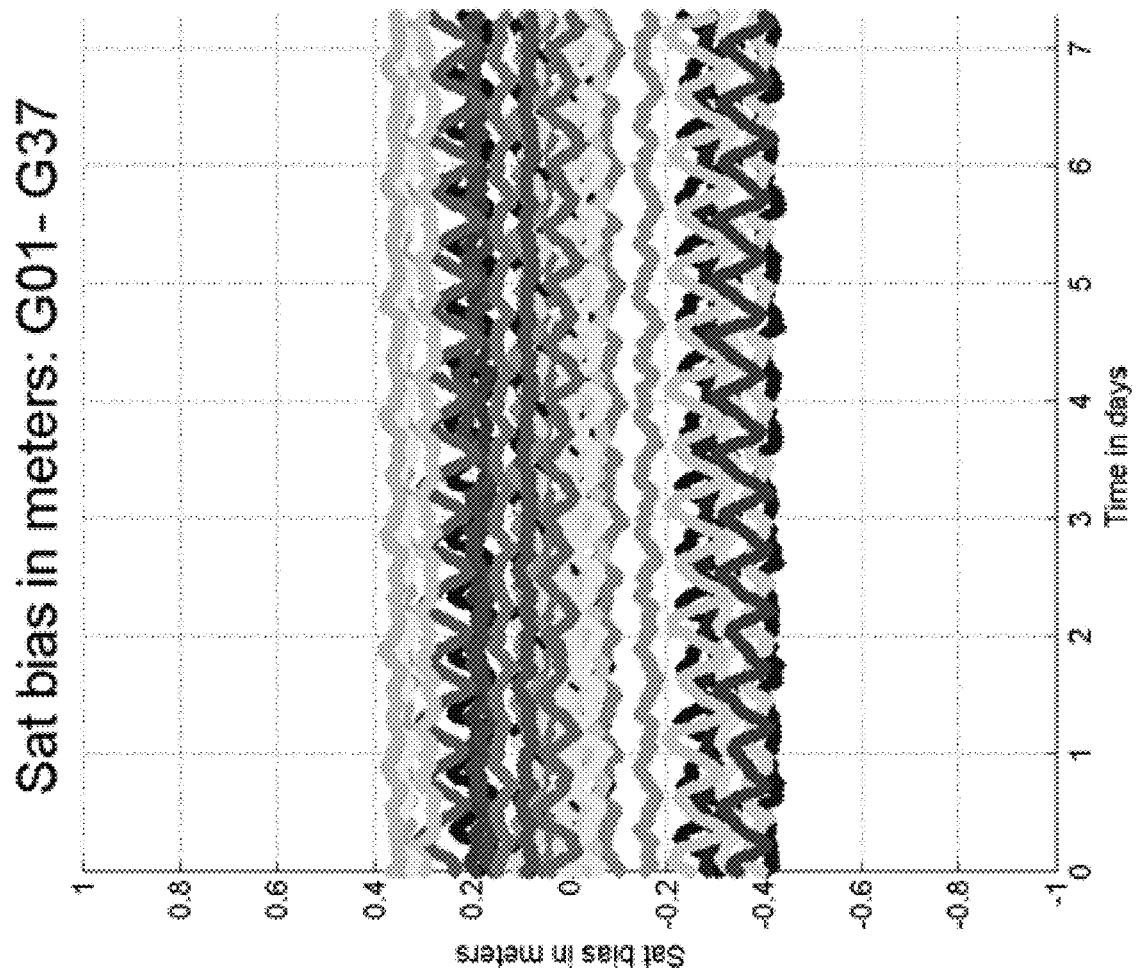
FIG. 9 shows the observed satellite wide-lane biases, in meters, in the signals transmitted by some GPS satellites (among satellites G01 to G37) over a period of one week.

In particular, FIG. 8 shows the bias, in meters, in the signals transmitted by some BeiDou satellites (among satellites C01 to C35) over a period of one week, whereas FIG. 9 shows the bias, in meters, in the signals transmitted by some GPS satellites (among satellites G01 to G37) over a period of one week. It can be observed that the bias observed for signals from BeiDou satellites (FIG. 8) fluctuates much more than the bias observed for signals from individual GPS satellites (FIG. 9).

Figure 10:
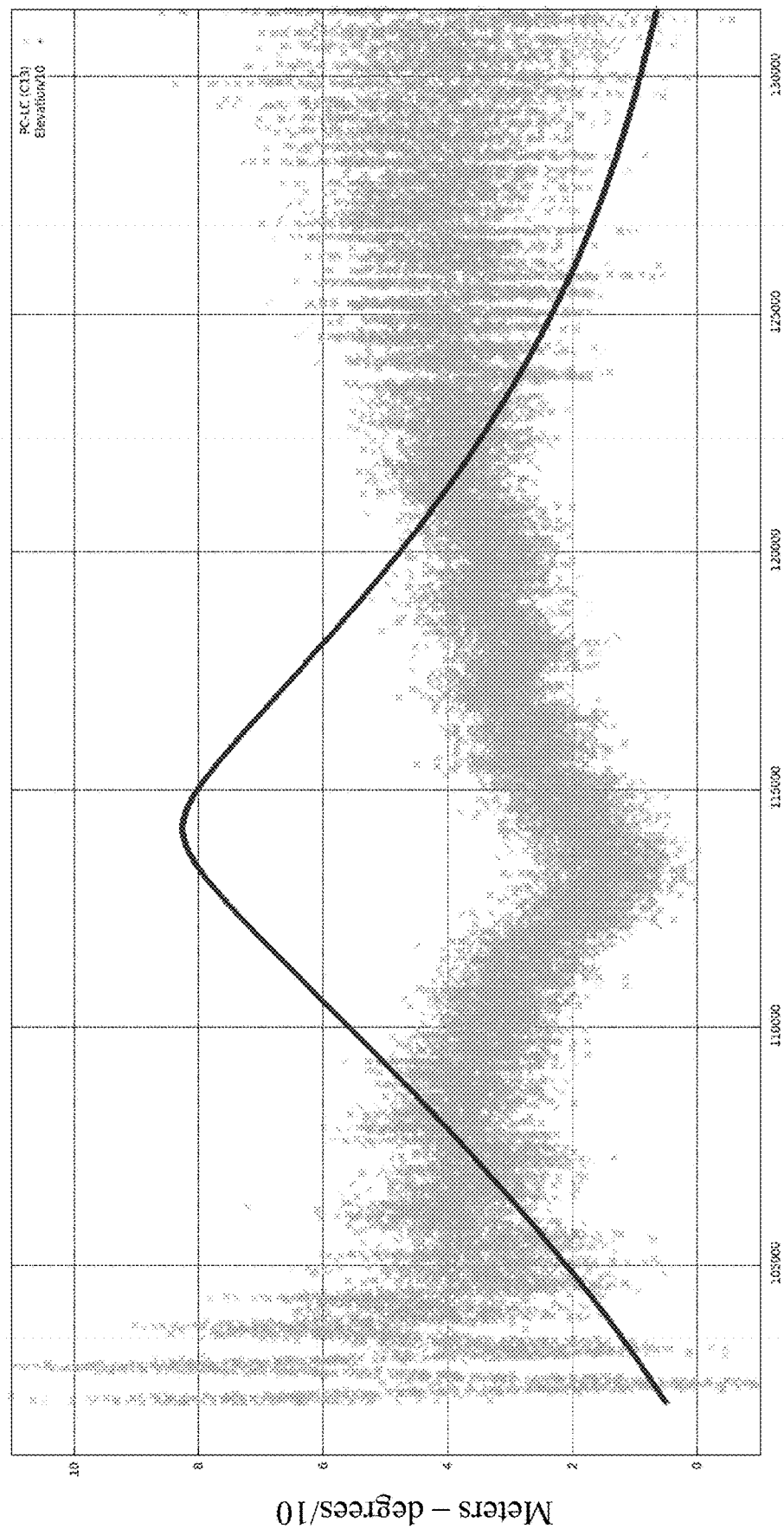
FIG. 10 shows the ionosphere-free pseudorange (PC) and phase (LC) combinations, i.e. "PC-LC", for one BeiDou satellite (C13) observed by one receiver (BKK9) over time, together with the satellite elevation as seen from the receiver.
Figure 11:
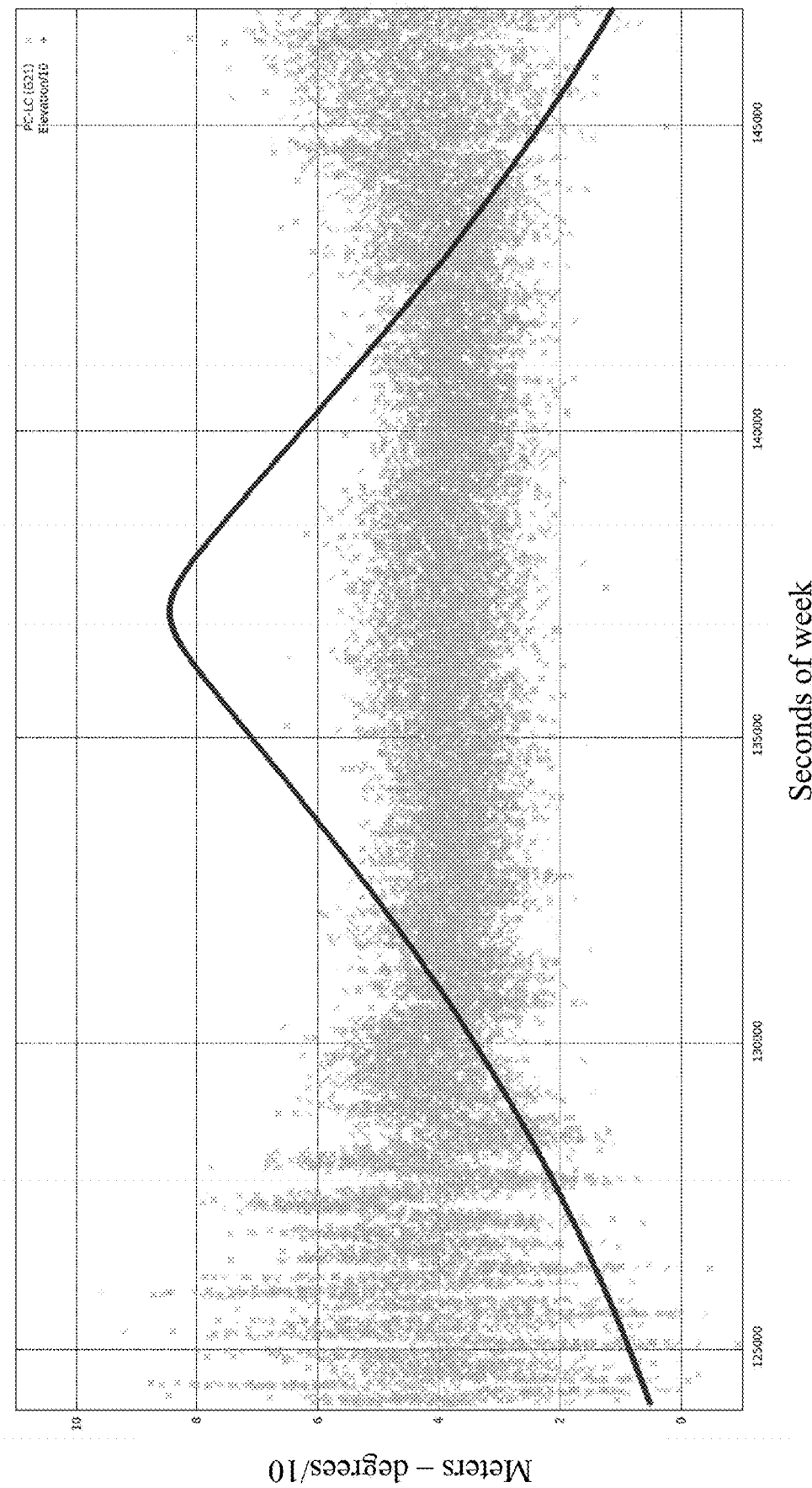
FIG. 11 shows the ionosphere-free pseudorange (PC) and phase (LC) combinations, i.e. "PC-LC", for one GPS satellite (G21) observed by one receiver (BKK9) over time, together with the satellite elevation as seen from the receiver.

FIG. 10 shows the ionosphere-free pseudorange (PC) and phase (LC) combinations, i.e. PC-LC, for one BeiDou satellite (C13) observed by one receiver (BKK9) over time, together with the satellite elevation (solid curve on the figure) as seen from the receiver. In contrast, FIG. 11 shows the ionosphere-free pseudorange (PC) and phase (LC) combinations, i.e., PC-LC, for one GPS satellite (G21) observed by one receiver (BKK9) over time, together with the satellite elevation (solid curve on the figure) as seen from the receiver. It can be observed that the bias observed for signals from BeiDou satellites (FIG. 10) significantly depends on elevation, whereas the bias observed for signals from GPS satellites does not significantly depend on the elevation (FIG. 11).

Figure 12:
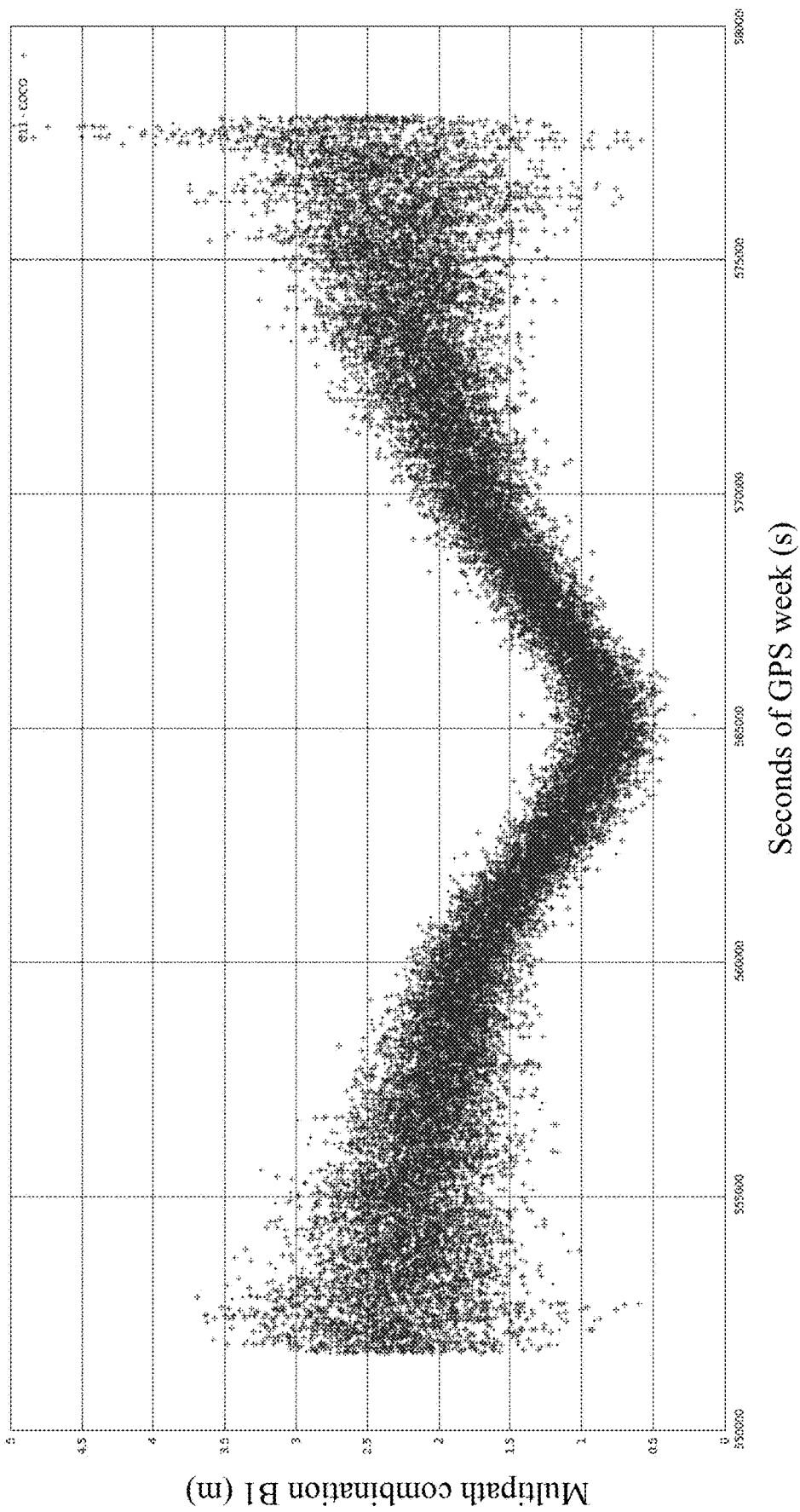
FIG. 12 shows a multipath combination based on observations from one receiver (Station COCO) as a function of time for a BeiDou satellite (C11)
Figure 13:
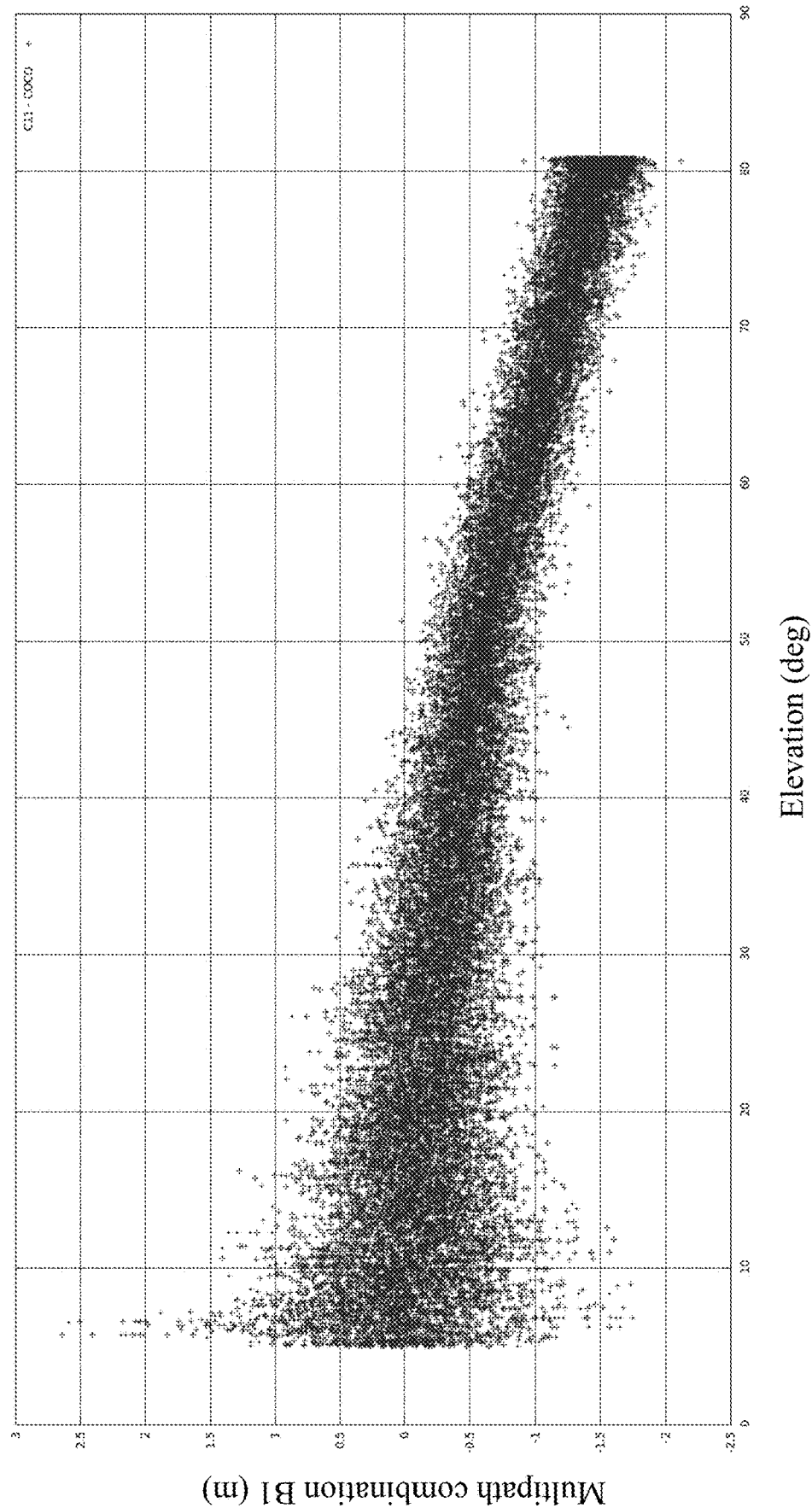
FIG. 13 shows a multipath combination based on observations from one receiver (Station COCO) as a function of the elevation angle in degrees for a BeiDou satellite (011)

FIG. 12 shows a so-called multipath combination (as explained below in section "A. The Multipath combination") computed based on observations from one receiver (Station COCO) over time for a BeiDou satellite (011). The multipath combination is very useful to observe the phenomenon, since it eliminates the effects of other factors, such as the geometry, the clocks, the ionosphere and the troposphere. FIG. 13 shows a multipath combination based on observations from the same receiver (Station COCO) as a function of the elevation angle in degrees for a BeiDou satellite (011). The nadir-angle dependency can be clearly observed on FIG. 13. In the light of the prior art GNSS model, the nadir-angle dependency is highly unexpected. The dependency does not depend on the nature of the receiver.

The method to correct the angle-dependent biases makes use, in one embodiment of the invention, of the multipath combinations. Sections A to C below first explain such combinations (including, in sections B and C, methods to correct nadir-angle dependent biases, in some embodiments of the invention), and then section D explains how the multipath combinations are used to integrate the angle-dependent GNSS signal biases into the position estimation process. Section E discusses some embodiments that involve checking the quality of the generated correction information. The possible physical origin of the nadir-angle biases is then discussed in section F, and how satellite designers can benefit from the invention is discussed in section G.

A. The Multipath combination

The "Multipath combination" ($MP_i$), as defined in J. Sanz-Subirana, J. Juan-Zornoza, and M. Hernandez-Pajares, *GNSS Data Processing. Volume II: Laboratory Exercises*. ESTEC, Noordwijk, The Netherlands: ESA Publications Division (ESA TM-23/2), May 2013 (hereinafter referred to as "reference [2]"), has the following expression:

$$\mathcal{M}P_i = P_i - L_i - 2\tilde{\alpha}_i(L_1 - L_2) \quad \text{(equation 1)}$$

where:

$P_i$: Pseudorange observation on frequency 'i' ($f_i$).
$L_i$, $L_j$: Carrier phase observations on $f_i$ and $f_j$, respectively.
$\tilde{\alpha}_i$: Frequency-related constant defined as:

$$\tilde{\alpha}_i = \frac{f_1^2 f_2^2}{f_i^2(f_1^2 - f_2^2)} \quad \text{(equation 2)}$$

In the $MP_i$ combination, the $P_i$–$L_i$ term cancels out the frequency-neutral effects such as geometry, clocks and troposphere, while the $2\tilde{\alpha}_i(L_1-L_2)$ term cancels out the ionospheric effects. The remainder is a mix of pseudorange and phase multipath effects, biases, phase ambiguities, residual wind-up effect and noise. Therefore, plotting the $MP_i$ should show a horizontal line with superimposed noise. The dominant noise source comes from pseudorange noise and multipath, and thus the noise sigma figure derived from $MP_i$ is roughly the sigma of the overall noise affecting the pseudorange, from the point of view of the receiver being used. However, the inventors have observed that some satellites may exhibit angle-dependent biases that cause the $MP_i$ to deviate from the former, ideal, "horizontal line plus noise" behaviour. This has been particularly observed in the case of satellites belonging to the BeiDou/COMPASS constellation, but this effect may also appear for other GNSS satellites.

B. Multipath Combination-Based Corrections

The procedure to find and correct the angle-dependent biases essentially consists in finding (for a given angle, frequency and satellite combination) the difference between the observed $MP_i$ values and a reference $MP_i$ horizontal line.

As explained below in section "C. Computing the corrections", this procedure is carried out taking a given angle as reference. Without loss of generality, that angle may be taken as an elevation angle (receiver point of view) or as a nadir angle (satellite point of view).

Now, let us introduce the following new terms: $Z_i(\alpha)$, being the angle-dependent effect on pseudorange $P_i$ for a given angle $\alpha$ and $\zeta_i(\alpha)$, being the angle-dependent effect on carrier phase $L_i$, for a given angle $\alpha$. For the sake of conciseness, these terms will be referred to hereinafter as $Z_i$ and $\zeta_i$, and their angle dependency will be implicit.

Then, the pseudorange and carrier phase observations may be redefined as:

$$P_i' = P_i + Z_i \quad \text{(equation 3)}$$

$$L_i' = L_i + \zeta_i \quad \text{(equation 4)}$$

where $P_i$, $L_i$ are the 'nominal', or 'biases-free' pseudorange and carrier phases, and $P_i'$, $L_i'$ are the 'real' observations (i.e., those affected by the angle-dependent biases).

Combining equation 1 with equations 3 and 4, the Multipath combination affected by angle-dependent biases becomes:

$$\mathcal{M}P_i' = P_i' - L_i' - 2\tilde{\alpha}_i(L_1' - L_2') \quad \text{(equation 5)}$$

$$\mathcal{M}P_i' = P_i - L_i - 2\tilde{\alpha}_i(L_1 - L_2) + [Z_i - \zeta_i - 2\tilde{\alpha}_i(\zeta_1 - \zeta_2)] \quad \text{(equation 6)}$$

The terms within square brackets are the angle-dependent terms that cause the $MP_i'$ to deviate from $MP_i$, and those are essentially the corrections generated by using the method described below in section "C. Computing the corrections". Therefore, the "Multipath combination-derived correction" $DMP_i$ is defined as:

$$D\mathcal{M}P_i = Z_i - \zeta_i - 2\tilde{\alpha}_i(\zeta_1 - \zeta_2) \quad \text{(equation 7)}$$

so that:

$$\mathcal{M}P_i' = P_i - L_i - 2\tilde{\alpha}_i(L_1 - L_2) + [Z_i - \zeta_i - 2\tilde{\alpha}_i(\zeta_1 - \zeta_2)] \Rightarrow$$
$$\mathcal{M}P_i' = \mathcal{M}P_i + D\mathcal{M}P_i \quad \text{(equation 8)}$$

When we apply $DMP_i$ to $P_i'$, the 'corrected' pseudorange $P_i^*$ is obtained:

$$P_i^* = P_i' - D\mathcal{M}P_i \quad \text{(equation 9)}$$

and, combining equation 3 and equation 7:

$$P_i^* = P_i + \zeta_i + 2\tilde{\alpha}_i(\zeta_1 - \zeta_2) \quad \text{(equation 10)}$$

Equation 10 states that the pseudorange corrected by following the method described in section "C. Computing the corrections" below is still affected by the carrier phase-related angle-dependent biases (in case they exist), so it is not completely free from those errors. The consequences of this fact are further explored in section D "The Melbourne-Wübenna combination".

C. Computing the Corrections

The process to compute the $DMP_i$ corrections, as already explained in a slightly more general manner with reference to FIG. 5, exploits the fact that the result of the $MP_i$ combination should be a horizontal line plus noise. Angle-dependent deviations from this ideal are computed using observations from several reference stations on different days, and averaging those differences within angle "bins" to get correction curves. The specific steps, in one embodiment of the invention, are as follows:

(Step 1) A software tool is used to read raw observations from observation files (for instance, files using the well-known RINEX industry standard format) and several combinations are computed such as multipath, MW, ionosphere free, etc., as well as elevation and nadir angles. Those results are stored in other intermediate-result files.

(Step 2) The former files are further subdivided into smaller files, first per system and then per satellite. These new files are hereinafter called "satellite" files.

(Step 3) Every "satellite" file is examined by plotting the multipath combination vs. time. Usable, continuous arcs are identified (either manually or automatically) and their start and end time tags identified.

(Step 4) With the above-mentioned information, another software tool is used to break down "satellite" files into "arc" files, each containing only multipath combinations vs. nadir (or elevation) angle for a single, continuous arc of a given satellite-receiver pair.

These "arcs" should, theoretically, be straight horizontal lines contaminated with multipath noise, and the level of these lines is arbitrary (indeed given by carrier phase ambiguities). However, the theoretical straight, horizontal lines are distorted as a function of nadir (or elevation) angle.

The extent and nature of this distortion is computed with respect to, i.e. relative to, a previously selected reference nadir/elevation angle, and there is no absolute reference point.

The correction is aimed at eliminating the distortion. Therefore, the residuals that will appear because of selecting a given reference angle should be constant, and absorbed by both ambiguities and satellite biases. Thus, they should not affect further signal processing if the distortion elimination procedure is carried out in a consistent way for all satellites involved.

(Step 5) All the "arc" files of a given satellite from several days and receivers are then fed to a software application that will:

(Step 5.a) Open a given arc file, and read the contents, then sorting the multipath combinations into "angle bins" (as illustrated on FIG. 14) in accordance with their corresponding nadir/elevation angle. An angle bin configuration for nadir angle may for example be 0.5 degrees-wide bins, ranging from 0 to 15 degrees (for a MEO satellite).

(Step 5.b) The multipath combination corresponding to a given angle bin is stored by adding it to an accumulator variable associated with that angle bin and satellite. Additional bin-related variables keep track of the number of values already stored in every angle bin.

(Step 5.c) When the "arc" file ends, the accumulator for each angle bin is divided by the corresponding number of multipath combinations stored, yielding a single value per angle bin: The average of all multipath combinations within that interval (0.5 degrees in this example), for that specific satellite arc. The former operation reduces the standard multipath (i.e., the receiver-environment multipath) as well as the normal signal noise, with the downside of reducing the angular resolution needed to accurately compute the aforementioned distortion. A bin size between 0.5 and 1.0 degrees is an appropriate trade-off value for nadir angle corrections.

(Step 5.d) So far, the per-bin averages have values that are arbitrary because they contain the ambiguity related to the arc. Therefore, a reference angle bin is selected (manually or automatically), and its average bias value is subtracted from the biases in all the bins. In such a way, only normalized average values remain that show how the distortion is behaving as a function of nadir angle, taking a given, common, nadir angle as reference.

(Step 5.e) Since the multipath combination does not follow a normal probability distribution, the per-bin averaging process does not get rid of some biases that affect the distortion function to be determined. Thus, the normalized average values previously determined are stored, the "arc" file is closed, and steps 5.a) to 5.d) are repeated for other "arc" files from different epochs and receivers, and stored separately.

(Step 6) When all the available "arc" files for a given satellite (and multiple receivers and days) are processed, the different average values for a given angle bin are further combined by finding their average. This should mitigate the multipath biases associated with a specific satellite-receiver-epoch combination.

The result of the above-described method is a file that contains lines with:

a) Nadir/elevation angle: The middle point of the angle bin is given, in degrees.

b) The average of all "normalized" arc averages (i.e., the correction), in meters.

c) The standard deviation of the mean (meters), i.e. the STD of all multipath combinations (for all arcs) going into that specific angle bin, divided by the square root of the total number of multipath combinations used in that angle bin. This provides a metric for overall correction accuracy.

d) The total number of multipath combinations (the multipath combination measurements) used in the angle bin.

D. The Melbourne-Wübenna combination

The Melbourne-Wübenna combination (MW) is often used to compute several parameters used by a GNSS positioning engine. This combination is a further combination of the "widelane" and "narrow-lane" combinations, which are defined as follows. The wide-lane combination is defined as:

$$L_W = \frac{f_1 L_1 - f_2 L_2}{f_1 - f_2} \qquad \text{(equation 11)}$$

The narrow-lane combination is defined as:

$$P_N = \frac{f_1 P_1 + f_2 P_2}{f_1 + f_2} \qquad \text{(equation 12)}$$

The Melbourne-Wübenna combination is defined as:

$$MW = L_W - P_N = \frac{f_1 L_1 - f_2 L_2}{f_1 - f_2} - \frac{f_1 P_1 + f_2 P_2}{f_1 + f_2} \qquad \text{(equation 13)}$$

Using equations 3, 4, 11 and 12, as well as the "nominal", "real" (') and "corrected" (*) notation introduced before, the following expressions are obtained:

$$\zeta_W = \frac{f_1 \zeta_1 - f_2 \zeta_2}{f_1 - f_2} \qquad \text{(equation 14)}$$

$$Z_N = \frac{f_1 Z_1 + f_2 Z_2}{f_1 + f_2} \qquad \text{(equation 15)}$$

$$MW' = L'_W - P'_N = \qquad \text{(equation 16)}$$
$$L_W + \zeta_W - (P_N + Z_N) \Rightarrow MW' = MW + (\zeta_W - Z_N)$$

The corresponding pseudorange- and carrier phase-related biases ($Z_x$ and $\zeta_x$) of equations 6 and 16 have opposite signs.

Equation 16 implies that using the procedure described in above section C only on the MW' combination, it is possible to find the MW-only correction DMW $$DMW = MW' - MW = \zeta_W - Z_N \quad \text{(equation 17)}$$

Now, the $DMP_i$ corrections (equation 7) are only applied to pseudoranges, obtaining the "corrected" pseudoranges $P_i^*$ (equations 9 and 10). If those "corrected" pseudoranges are introduced in equation 12, the result is:

$$P_N^* = \frac{f_1 P_1^* + f_2 P_2^*}{f_1 + f_2} = \quad \text{(equation 18)}$$

$$\frac{f_1(P_1 + \zeta_1 + 2\tilde{\alpha}_1(\zeta_1 - \zeta_2)) +}{f_1 + f_2}$$
$$\frac{f_2(P_2 + \zeta_2 + 2\tilde{\alpha}_2(\zeta_1 - \zeta_2))}{f_1 + f_2} \Rightarrow P_N^* = \frac{f_1 P_1 + f_2 P_2}{f_1 + f_2} +$$
$$\frac{f_1 \zeta_1 + f_2 \zeta_2}{f_1 + f_2} + \frac{2 f_1 \tilde{\alpha}_1 (\zeta_1 - \zeta_2) + 2 f_2 \tilde{\alpha}_2 (\zeta_1 - \zeta_2)}{f_1 + f_2} \Rightarrow$$
$$P_N^* = P_N + (\zeta_N + 2\tilde{\alpha}_W (\zeta_1 - \zeta_2))$$

where:

$$\tilde{\alpha}_W = \frac{f_1 f_2}{f_1^2 - f_2^2}$$

After some manipulation, it can be shown that (see equation 14):

$$\zeta_N + 2\tilde{\alpha}_W(\zeta_1 - \zeta_2) = \zeta_W$$

Therefore:

$$P_N^* = P_N + \zeta_W \quad \text{(equation 19)}$$

Now, if the $P_N^*$ "corrected" narrow-lane pseudorange (equation 19) is combined with the $L_W'$ "observed" or "uncorrected" wide-lane carrier-phase (equation 11) in order to get the MW* ("partially-corrected") Melbourne-Wübbena combination, the result is:

$$MW^* = L_W' - P_N^* = (L_W + \zeta_W) - P_N + \zeta_W) \Rightarrow MW^* = L_W - P_N \quad \text{(equation 20)}$$

An important conclusion may be drawn from equation 20: The process outlined on Section C generates pseudorange corrections $DMP_i$ that are contaminated with possible carrier-phase angle-dependent bias terms (see equation 10). However, those extra terms are nevertheless completely cancelled out when forming the MW combination with the uncorrected carrier-phase observations.

So, even though the process described above in section C can be directly used on the MW combination to generate the MW-only correction DMW (equation 17), it is more useful to compute the pseudorange corrections $DMP_i$ because they both mostly correct the pseudoranges and also completely correct the MW combination.

E. Optional Quality Check Method

In one embodiment, the correctness of the generated correction information is checked. This may be useful notably, but not only, (i) to make sure that a sufficient number of raw observations has been used for generating the correction information, (ii) to make sure that multipath effects on the reference receivers (used to obtained the raw observations) were not too high, and/or (iii) to make sure that some of the reference receivers have not been subject to intentional or unintentional jamming or interference.

For example, in order to check the correctness of the corrections generated as output from FIG. 4 and FIG. 5, the following method may be carried out.

First, the "Group and Phase Ionospheric Calibration" combination (known in the art as the "GRAPHIC" combination) is computed from the raw observation data on at least two frequencies.

The GRAPHIC combination for a given frequency "I" is defined as:

$$G_i = \frac{P_i + L_i}{2} \quad \text{(equation 21)}$$

This GRAPHIC "$G_i$" combination is not affected by first order ionosphere effects, and its noise level is roughly half of the original $P_i$ pseudorange. On the one hand, it includes carrier phase-related terms like the $L_i$ ambiguity and the well-known antenna wind-up effect. Taking into account equations 3 and 4, the GRAPHIC combination affected by the angle-dependent biases becomes:

$$G_i' = \frac{P_i + Z_i + L_i + \zeta_i}{2} \quad \text{(equation 22)}$$

Now, selecting signals from any two frequencies (denoted as "1" and "2" here), the difference between the "$G_i'$" combinations on those frequencies is computed:

$$\Delta G_{12}' = G_1' - G_2' = \quad \text{(equation 23)}$$

$$\frac{P_1 + Z_1 + L_1 + \zeta_1}{2} - \frac{P_2 + Z_2 + L_2 + \zeta_2}{2} \Rightarrow \Delta G_{12}' =$$

$$(G_1 - G_2) + \frac{(Z_1 - Z_2) + (\zeta_1 - \zeta_2)}{2}$$

The importance of equation 23 is that the term to the right is half the difference between the "Multipath combination-derived corrections" $DMP_i$ for frequencies 1 and 2, as defined in equation 7. Therefore, equation 23 becomes:

$$2\Delta G_{12}' = 2(G_1 - G_2) + \Delta D\mathcal{M} P_{12} \quad \text{(equation 24)}$$

The difference $(G_1 - G_2)$ is free of ionospheric effects and also cancels all the geometric, tropospheric, and clock effects. Therefore, the remainder is only composed of the difference of carrier phase ambiguities, receiver and satellite biases, wind-up, and antenna phase center effects, plus noise. Since the wind-up and the antenna phase center effects can be properly modelled and removed, the difference $(G_1 - G_2)$ is an arbitrary constant plus noise.

Taking into account the former paragraph, equation 24 may be re-written as:

$$\Delta D\mathcal{M} P_{12} - 2\Delta G_{12}' \cong K \quad \text{(equation 25)}$$

The parameter "K" remains an arbitrary constant within a given arc (i.e., while no cycle-slips occur on a received signal).

The importance of equation 25 is that it represents a simple but effective way to check that the correction information output from the methods illustrated by FIGS. 4 and 5 is indeed of good quality: The difference in the corrections for a given pair of frequencies, when subtracting twice the difference of the GRAPHIC combinations for those frequencies, must yield a constant value with some superimposed noise (the standard deviation of such noise is effectively the standard deviation of the pseudorange noise).

Then, a tolerance value may be set (as a function of pseudorange noise) for how the difference stated in equation 25 is allowed to drift from the arbitrary constant "K". If the drift surpasses the said tolerance value, then the width of the angle bins, the number of samples being used, the number of reference stations being used, the length of the observation period, or a combination thereof, may be adjusted in order to bring back the correction values within the preset tolerance.

F. Possible Origin of the Nadir-Angle Dependence

Figure 15:
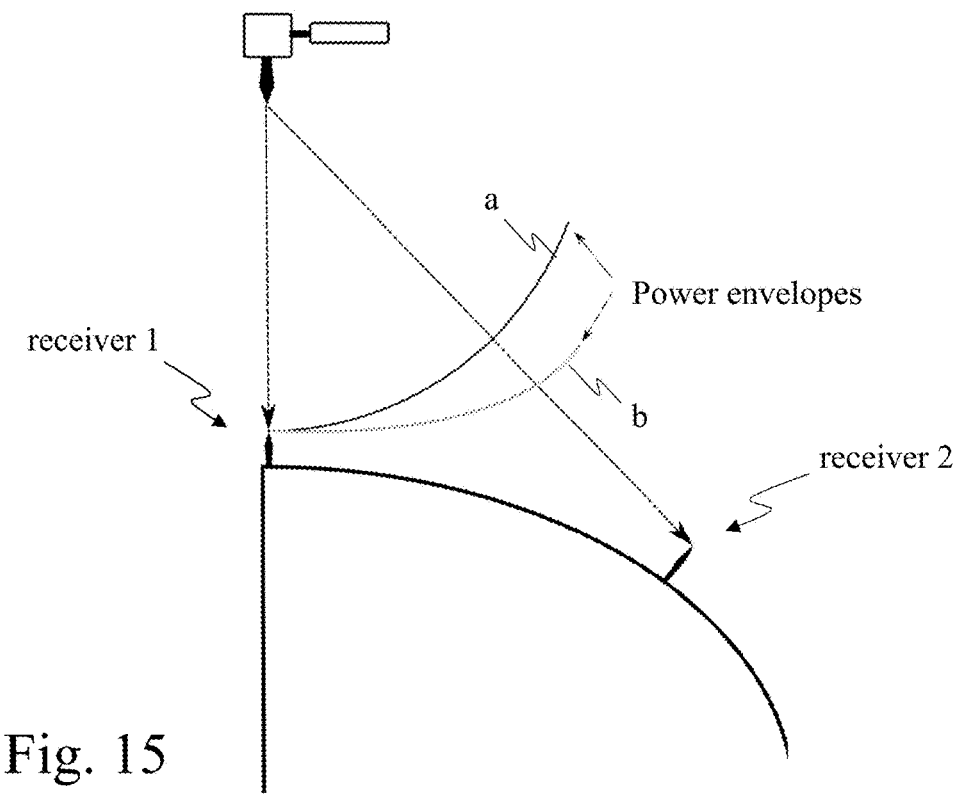
FIG. 15 schematically illustrates exemplary power envelopes of a satellite, in order to understand, or partially understand, the possible origin of the detected nadir-angle biases addressed by embodiments of the invention.
Figure 16:
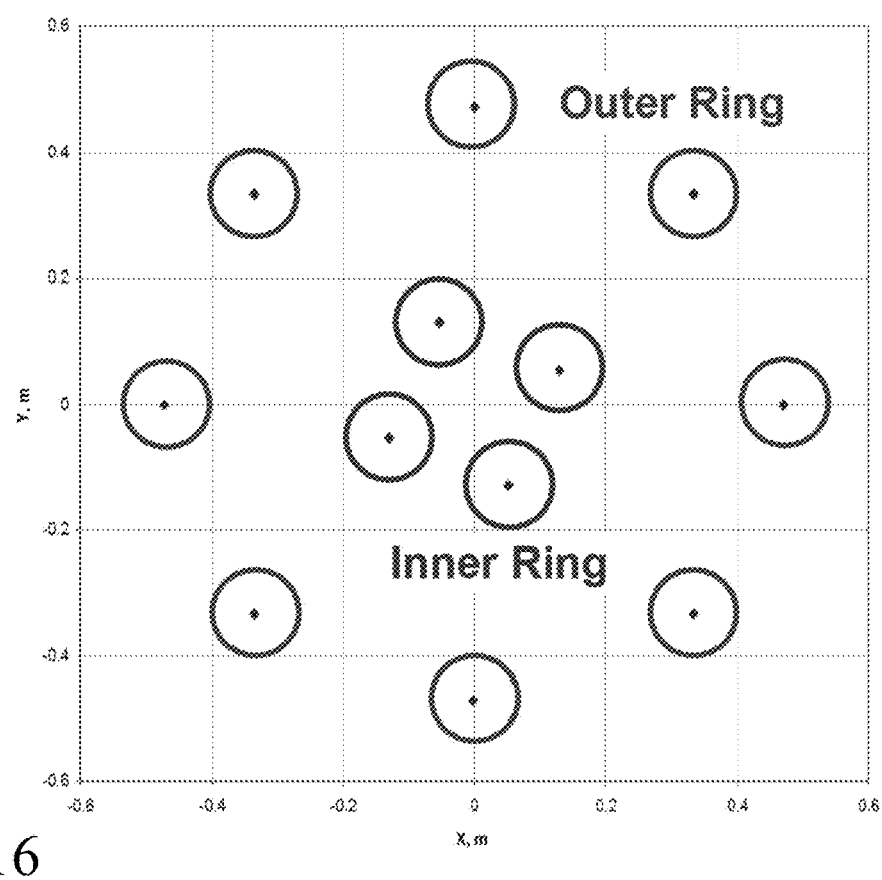
FIG. 16 schematically illustrates two exemplary rings of antennas, also in order to understand, or partially understand, the possible origin of the detected nadir-angle biases addressed by embodiments of the invention.
Figure 17:
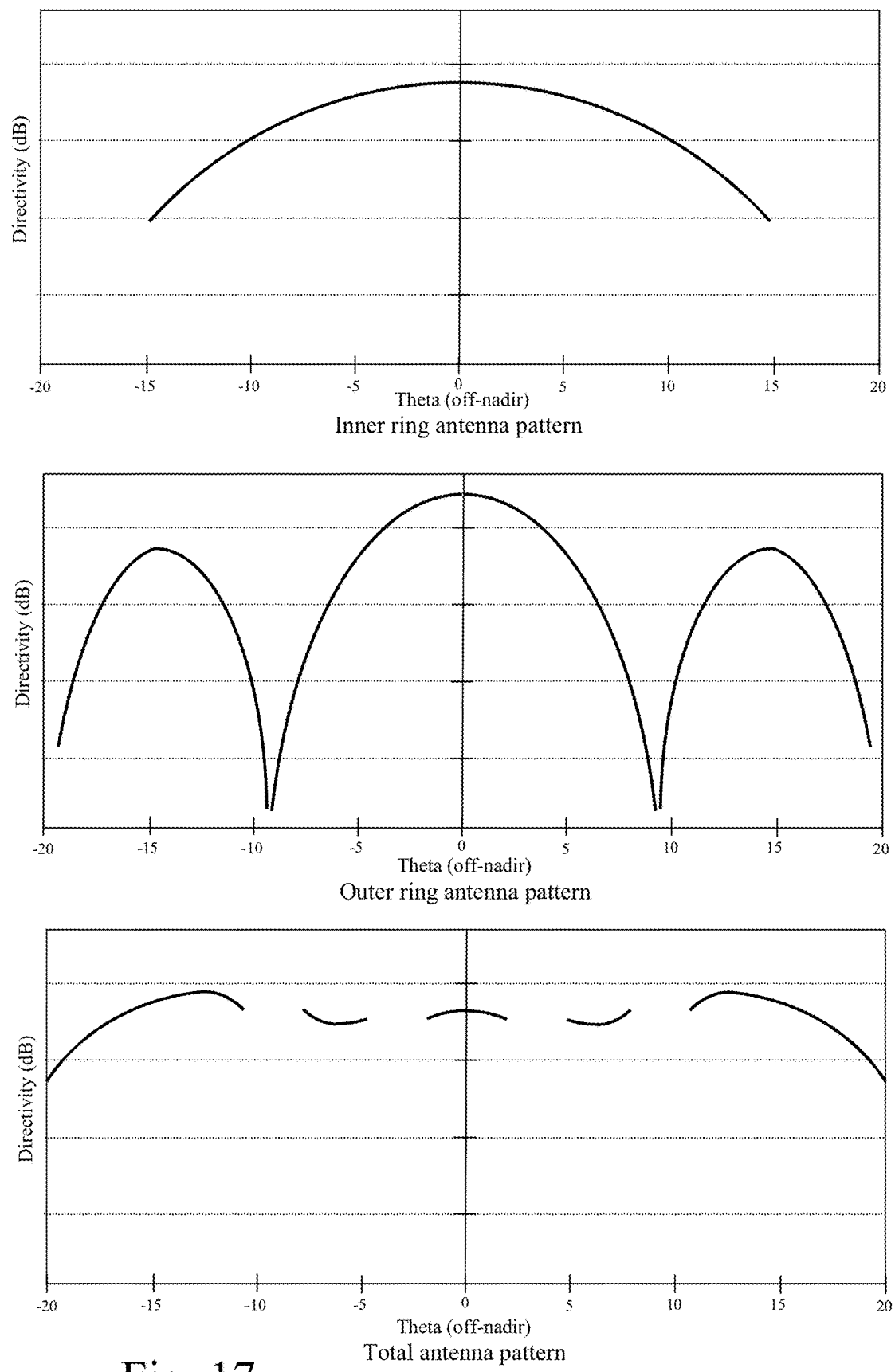
FIG. 17 schematically illustrates exemplary radiation patterns of two rings of antennas (inner and outer), as well as a total radiation pattern for a satellite's antenna system, in order to further the understanding of the possible origin of the detected nadir-angle biases addressed by embodiments of the invention.

Now, to understand the possible origin of the nadir-angle dependence, reference is made to FIGS. 15 to 17. It should be noted however that the inventors are unable to guarantee that the following provides a complete and correct explanation of this physical phenomenon. This, however, by no means affects the capability of putting the invention into practice. In other words, a complete and correct explanation of the physical phenomenon is not necessary to benefit from the invention and its embodiments.

When a GNSS satellite orbits the Earth, the distance between the GNSS satellite and different points of the Earth's surface differs, as illustrated by FIG. 15. In particular, the distance from the satellite to a receiver seen by the satellite with a nadir angle close to zero (e.g., "receiver 1" in FIG. 15) is smaller than the distance from the satellite to a receiver seen by the satellite with a larger nadir angle (e.g., "receiver 2" in FIG. 15). This also means that, for a signal from the satellite to reach the Earth surface with a relatively constant power whatever the point on Earth, the satellite has to emit less power towards receiver 1 than towards receiver 2.

Exemplary power envelopes are illustrated on FIG. 15 to explain this. Rather than having a power envelope with a constant value depending on the nadir angle (power envelope "a" in FIG. 15), a satellite's radiation pattern should show a power envelope for which more power is sent for larger nadir angles, to compensate for the larger distances (power envelope "b" in FIG. 15).

Thus, a suitable antenna pattern and specific antenna configurations are required. Some satellites comprise two rings of antennas (a phase array), an inner ring and an outer ring, as illustrated in FIG. 16, which comes from David Goldstein, "*Request for Feedback on GPS IIR-20 (SVN-49) Mitigation Options*", U.S. Coast Guard Navigation Center, 5 Mar. 2010, retrieved on Nov. 29, 2013 from http://www.navcen.uscg.gov/pdf/gps/news/Mar2010_svn49/GPSW_SVN_49_inf_Brief_Mar_2010_Final.pdf (hereinafter referred to as "reference [3]"). The inner ring provides a radiation pattern such as one depicted on the first graph (top) of FIG. 17 (one lobe), the outer ring provides a radiation pattern such as one depicted on the second graph of FIG. 17 (three lobes between –20 and 20 degrees), and the resulting radiation pattern provided by both rings of antennas is depicted on the third graph (bottom) (with larger power around about –12 and 12 degrees). FIG. 17 is derived from FIG. 3 of Gary Fay, Paul Crampton, "*Methodology for Modeling the SVN49 Anomaly for Static Scenarios*", ION ITM 2011 (hereinafter referred to as "reference [4]").

Moreover, it is believed that the contributions to the radiated signal from the inner ring and the outer ring respectively vary depending on the nadir angle, that the internal satellite configuration of the inner and outer ring antenna electronic circuits may differ in such a manner that the delay to which the signals are subject to differ, this leading, globally, the signal delay to vary depending on the nadir angle. For example, satellite internal multipath (caused by reflection by filters, etc.) may also lead the delays associated with the inner and outer ring to differ.

Reference [3] exclusively refers to a single, faulty satellite, i.e. the SVN-49 satellite, wherein there is a L5 filter connected to the J2 port. The SVN-49 satellite has been decommissioned since then, after two years of its intended twelve-year operation life, since it was considered faulty, due a singular and peculiar design defect. This design defect affecting the SVN-49 satellite was all the more unique in that it was due to a rush to retrofit a conventional GPS satellite for reserving, under the International Telecommunication Union (ITU) rules, the L5 frequency. In contrast, embodiments of the invention focus on a plurality of GNSS satellites, such for example an entire constellation of satellites having all the same design.

G. Satellite Design

The invention also relates, in one embodiment, to a method for designing, using a satellite design program, any one of a GNSS satellite and a subsystem thereof. Indeed, as explained above, embodiments of the invention not only enable GNSS receivers to cope with satellites having an antenna design causing what might be referred to as "anomalous" angle-dependent patterns (in such as a case, one would speak about unintentional nadir-angle dependent biases, and faulty or defective satellites), but the invention also enables relaxed requirements regarding the design of satellites (in such as a case, one would rather speak about "intentional" nadir-angle dependent biases). This in turn enables GNSS satellite designers to consider a larger range or selection of antenna designs and space-qualified components when designing GNSS satellites, and therefore the design of more robust and/or low-cost satellites.

In one embodiment, such a method comprises a step of making a design of a GNSS satellite or a subsystem thereof, in which, for at least one frequency, the delays of the signals radiated over different nadir angles of the radiation pattern of the satellite's antenna designed to be, in orbit, directed towards the Earth, are taken into account by the satellite design program to decide whether a design of a GNSS satellite or of a subsystem thereof respectively is acceptable. In other words, in this embodiment, when designing a satellite, not only the antenna pattern of the satellite is taken into account (which is known in the art) but the delays of the signals radiated over different nadir angles are also taken into account.

By "satellite design program", it is referred here to any kind of software tool for assessing or simulating a design of a satellite or of a subsystem thereof (taking data representing a satellite design and/or the specification of individual components or sub-systems under consideration as input parameters) and then determining whether the design meets some requirements. The satellite design program may also be, or comprise, any kind of software tool for generating, automatically, a plurality of designs and running a simulation, testing or validation procedure to ensure that the satellite, or one of its components, works within the specifications. A simulation software tool may for example be 'Simulink' (an extension of Matlab by the Mathworks Co.). Other packages may be used. When designing radio frequency (RF) electronics or the like, design programs are important. The design programs may for example work at the component level (selecting components like amplifier, mixers and combiners, which are typical for a satellite) or at the satellite level. Components typically have specifications which may be inputted to a design program to determine whether certain conditions or goals are met.

In one embodiment, the delays of the signals radiated over different nadir angles, as mentioned above, are taken into account by the satellite design program to decide whether the design of the GNSS satellite or of the subsystem thereof respectively is acceptable in the sense that the difference $$delay_{max} - delay_{min}$$

is taken into account by the satellite design program to decide (i.e., determine) whether the design of the GNSS satellite or of the subsystem thereof is acceptable, where $delay_{max}$ is the maximum delay occurring at a nadir angle over a range of nadir angles from 0 to α; and $delay_{min}$ is the minimum delay occurring at a nadir angle over a range of nadir angles from 0 to α.

In one embodiment, the above-mentioned method is such that the satellite design program decides that a design of the GNSS satellite or of the subsystem thereof is acceptable if the difference $$delay_{max} - delay_{min} < m_{acceptable},$$

where $m_{acceptable}$ is a value inputted into the satellite design program (or simulation program).

This embodiment enables satellite designers to specify, as input to the design program, a relaxed specification regarding the maximum value $m_{acceptable}$ that the difference $delay_{max} - delay_{min}$ may take, while still leading to an acceptable design, knowing that correction information can be later generated (with the method for generating correction information as discussed above, and illustrated with reference to FIG. 4) and sent to, and used by, the GNSS receivers (thanks to the method for using the correction information as discussed above, and illustrated with reference to FIG. 1). In other words, the underlying rationale behind the design method according to this embodiment is that satellite-specific, nadir-dependent correction information can be generated and made available to the receivers, and thus relaxed specifications can be used.

In one embodiment, for the at least one frequency, $m_{acceptable}$ is greater than a quarter of the carrier wavelength of the emitted signal. This embodiment provides a specific value for the relaxed delay difference permitted by the invention, still enabling the GNSS satellite (to be designed, then later manufactured, launched and operated) to be used in high-precision, carrier-based positioning methods with ambiguity fixing. Embodiments of the invention enable to relax the stringent requirement that, without the invention, would be that $m_{acceptable}$ would have to be smaller than a quarter of the carrier wavelength of the emitted signal.

In the exemplary case of GPS L1 signals, for carrier phase ranging, $m_{acceptable}$ would have to be 5 cm without the invention. Thanks to the invention, this requirement is relaxed. Namely the maximum value $m_{acceptable}$ may be larger than 5 cm, and the ambiguity resolution process may still be reliable and enables accurate GNSS positioning.

Still in the exemplary case of GPS L1 signals, but for pseudorange-based ranging, $m_{acceptable}$ would have to be, without the invention, smaller than the pseudorange noise as measured by the receiver (for example 25 or 50 cm, depending on the receivers). Thanks to the invention, this requirement is relaxed. Namely the maximum value $m_{acceptable}$ may be larger than the pseudorange noise (for example 25 or 50 cm), and both the pseudorange-based ranging and the ambiguity resolution process may still be reliable and enable accurate GNSS positioning.

In a sub-embodiment, for the at least one frequency, $m_{acceptable}$ is greater than the carrier wavelength of the emitted signal.

In a yet a further sub-embodiment, for the at least one frequency, $m_{acceptable}$ is greater than five times the carrier wavelength of the emitted signal.

Regarding the maximum delay difference $m_{acceptable}$ supported by embodiments of the invention, there is no specific value that exists. For example, in the case of GPS L1 signals, delay differences above 1.5 meter have been tested and are supported. Thus, in one embodiment, $m_{acceptable}$ is greater than five times the carrier wavelength of the emitted signal and there is no upper limit for $m_{acceptable}$. In another embodiment, $m_{acceptable}$ is comprised between five and fifteen times the carrier wavelength of the emitted signal.

In one embodiment, the above-mentioned method is used for designing a GNSS satellite for use in or near an orbit having a minimum satellite altitude h with respect to the Earth surface, wherein a is a value comprised between $$0.95 \cdot \arcsin\left(\frac{R}{R+h}\right) \text{ degrees}$$

and $$1.05 \cdot \arcsin\left(\frac{R}{R+h}\right) \text{ degrees},$$

where R is the mean Earth radius. This therefore differs whether GEO, MEO or LEO satellites are designed.

H. Additional Remarks

Any of the above-described methods and their embodiments may be implemented by means of a computer program. The computer program may be loaded on an apparatus, a rover, a receiver or a network station as described above. Therefore, the invention also relates to a computer program, which, when carried out on an apparatus, a rover, a receiver or a network station as described above, carries out any one of the above-described methods and their embodiments.

The invention also relates to a computer-readable medium or a computer-program product including the above-mentioned computer program. The computer-readable medium or computer-program product may for instance be a magnetic tape, an optical memory disk, a magnetic disk, a magneto-optical disk, a CD ROM, a DVD, a CD, a flash memory unit or the like, wherein the computer program is permanently or temporarily stored. The invention also relates to a computer-readable medium (or to a computer-program product) having computer-executable instructions for carrying out any one of the methods of the invention.

The invention also relates to a firmware update adapted to be installed on receivers already in the field, i.e. a computer program which is delivered to the field as a computer program product. This applies to each of the above-described methods and apparatuses.

GNSS receivers may include an antenna, configured to receive the signals at the frequencies broadcasted by the satellites, processor units, one or more accurate clocks (such as crystal oscillators), one or more central processing units (CPU), one or more memory units (RAM, ROM, flash memory, or the like), and a display for displaying position information to a user.

Where the terms "first receiving unit", "generating unit" and the like are used herein as units (or sub-units) of an apparatus (such as a GNSS receiver), no restriction is made regarding how distributed the constituent parts of a unit (or sub-unit) may be. That is, the constituent parts of a unit (or sub-unit) may be distributed in different software or hardware components or devices for bringing about the intended function. Furthermore, the units may be gathered together for performing their functions by means of a combined, single unit (or sub-unit).

The above-mentioned units and sub-units may be implemented using hardware, software, a combination of hardware and software, pre-programmed ASICs (application-specific integrated circuit), etc. A unit may include a central processing unit (CPU), a storage unit, input/output (I/O) units, network connection devices, etc.

Although the present invention has been described on the basis of detailed examples, the detailed examples only serve to provide the skilled person with a better understanding, and are not intended to limit the scope of the invention. The scope of the invention is much rather defined by the appended claims.

The invention claimed is:

1. Method for generating correction information for use by a global or regional navigation satellite system receiver, hereinafter abbreviated as NSS receiver, to determine a position of the NSS receiver, the correction information hereinafter referred to as "satellite-specific-nadir-angle-dependent-correction-information", the satellite-specific-nadir-angle-dependent-correction-information associated with each of at least two navigation satellite system (NSS) satellites among a plurality of NSS satellites, wherein the satellite-specific-nadir-angle-dependent-correction-information associated with a NSS satellite comprises correction information depending on the nadir angle of a receiver as seen from the NSS satellite, so as to mitigate effects of satellite-specific, nadir-angle dependent biases in the NSS signals from the NSS satellite, the method comprising, for each NSS satellite among the at least two NSS satellites:

receiving raw observations obtained by observing NSS signals from the NSS satellite from a plurality of reference stations;

computing combination values based on the raw observations to cancel out effects of satellite motion relative to the reference stations, effects of clocks, effects of troposphere and effects of ionosphere;

assigning the computed combination values into a plurality of nadir angle ranges, each nadir angle range being hereinafter referred to as an "angle bin";

selecting a reference angle bin among the angle bins;

generating, for each angle bin, a representative combination value based on all the computed combination values that are associated with nadir angles that fall within said angle bin, wherein the representative combination value generated for the reference angle bin is a satellite-specific reference value that is constant over all nadir angles;

normalizing, for each angle bin, the representative combination value generated for the angle bin, based on a difference between the representative combination value generated for the reference angle bin and the representative combination value generated for the angle bin, to generate a normalized representative combination value for each angle bin;

generating the satellite-specific-nadir-angle-dependent-correction-information based on the normalized representative combination values; and sending the satellite-specific-nadir-angle-dependent-correction-information to the NSS receiver for use in determining the position of the NSS receiver.

2. Method of claim 1, wherein observing the NSS signals, on the basis of which the raw observations are obtained, comprises doing so over a plurality of consecutive days.

3. Method of claim 1, wherein computing combination values comprises computing multipath combination values based on the raw observations to cancel out the effects of the satellite motion relative to the reference stations, the effects of the clocks, the effects of the troposphere and the effects of the ionosphere.

4. Method of claim 1, wherein computing combination values comprises computing Melbourne-Wübbena combination values based on the raw observations to cancel out the effects of the satellite motion relative to the reference stations, the effects of the clocks, the effects of the troposphere and the effects of the ionosphere.

5. Method of claim 1, wherein computing combination values comprises computing ionosphere-free pseudorange minus carrier phase (PC-LC) combination values based on the raw observations to cancel out the effects of the satellite motion relative to the reference stations, the effects of the clocks, the effects of the troposphere and the effects of the ionosphere.

6. Method of claim 1, wherein computing combination values comprises computing geometry-free, also called "ionospheric", pseudorange and carrier phase combinations based on the raw observations to cancel out the effects of the satellite motion relative to the reference stations, the effects of the clocks, and the effects of the troposphere; and using another information source to cancel out the effects of the ionosphere.

7. Method of claim 6, wherein the other information source used to cancel out the effects of the ionosphere is an ionospheric map.

8. Method of claim 1, wherein generating satellite-specific-nadir-angle-dependent-correction-information comprises generating at least one calibration table to be sent to a plurality of NSS receivers.

9. Method of claim 1, wherein generating satellite-specific-nadir-angle-dependent-correction-information comprises generating coefficients for a polynomial expression, wherein the coefficients are to be sent to a plurality of NSS receivers.

10. A non-transitory computer readable medium comprising computer-executable instructions configured, when executed on a computer, to carry out a method according to claim 1.

11. Method for generating correction information, hereinafter referred to as "satellite-specific-nadir-angle-dependent-correction-information", associated with each of at least two navigation satellite system (NSS) satellites among a plurality of NSS satellites, wherein the satellite-specific-nadir-angle-dependent-correction-information associated with a NSS satellite comprises correction information depending on the nadir angle of a receiver as seen from the NSS satellite, so as to mitigate effects of satellite-specific, nadir-angle dependent biases in the NSS signals from the NSS satellite, the method comprising, for each NSS satellite among the at least two NSS satellites:

receiving raw observations obtained by observing NSS signals from the NSS satellite from a plurality of reference stations;

computing combination values based on the raw observations to cancel out effects of satellite motion relative to the reference stations, effects of clocks, effects of troposphere and effects of ionosphere;

assigning the computed combination values into a plurality of nadir angle ranges, each nadir angle range being hereinafter referred to as an "angle bin";

selecting a reference angle bin among the angle bins;
generating, for each angle bin, a mean combination value by taking the average of all the computed combination values that are associated with nadir angles that fall within said angle bin, wherein the mean combination value generated for the reference angle bin is a satellite-specific reference value that is constant over all nadir angles;
normalizing, for each angle bin, the mean combination value generated for the angle bin, by subtracting the mean combination value generated for the reference angle bin from the mean combination value generated for the angle bin, to generate a normalized mean combination value for each angle bin;
generating the correction information based on the normalized mean combination values; and
sending the correction information to the NSS receiver for use in determining the position of the NSS receiver.

12. Apparatus configured for generating correction information for use by a global or regional navigation satellite system receiver, hereinafter abbreviated as NSS receiver, to determine a position of the NSS receiver, the correction information hereinafter referred to as "satellite-specific-nadir-angle-dependent-correction-information", the satellite-specific-nadir-angle-dependent-correction-information associated with each of at least two navigation satellite system (NSS) satellites among a plurality of NSS satellites, wherein the satellite-specific-nadir-angle-dependent-correction-information associated with a NSS satellite comprises correction information depending on the nadir angle of a receiver as seen from the NSS satellite, so as to mitigate effects of satellite-specific, nadir-angle dependent biases in the NSS signals from the NSS satellite, the apparatus comprising:
a first unit, hereinafter referred to as "receiving unit", configured for, for each NSS satellite among the at least two NSS satellites, receiving raw observations obtained by observing NSS signals from the NSS satellite from a plurality of reference stations;
a second unit, hereinafter referred to as "processing unit", configured for, for each NSS satellite among the at least two NSS satellites:
computing combination values based on the raw observations to cancel out effects of satellite motion relative to the reference stations, effects of clocks, effects of troposphere and effects of ionosphere;
assigning the computed combination values into a plurality of nadir angle ranges, each nadir angle range being hereinafter referred to as an "angle bin";
selecting a reference angle bin among the angle bins;
generating, for each angle bin, a representative combination value based on all the computed combination values that are associated with nadir angles that fall within said angle bin, wherein the representative combination value generated for the reference angle bin is a satellite-specific reference value that is constant over all nadir angles; and
normalizing, for each angle bin, the representative combination value generated for the angle bin, based on a difference between the representative combination value generated for the reference angle bin and the representative combination value generated for the angle bin, to generate a normalized representative combination value for each angle bin;
a third unit, hereinafter referred to as "generating unit", configured for, for each NSS satellite among the at least two NSS satellites:
generating the satellite-specific-nadir-angle-dependent-correction-information based on the normalized representative combination values; and
sending the satellite-specific-nadir-angle-dependent-correction-information to the NSS receiver for use in determining the position of the NSS receiver.

13. Apparatus of claim 12, wherein the processing unit is configured for computing multipath combination values based on the raw observations to cancel out the effects of the satellite motion relative to the reference stations, the effects of the clocks, the effects of the troposphere and the effects of the ionosphere.

14. Apparatus of claim 12, wherein the processing unit is configured for computing Melbourne-Wiibbena combination values based on the raw observations to cancel out the effects of the satellite motion relative to the reference stations, the effects of the clocks, the effects of the troposphere and the effects of the ionosphere.

15. Apparatus of claim 12, wherein the processing unit is configured for computing ionosphere-free pseudorange minus carrier phase, hereinafter abbreviated as "PC-LC", combination values based on the raw observations to cancel out the effects of the satellite motion relative to the reference stations, the effects of the clocks, the effects of the troposphere and the effects of the ionosphere.

16. Apparatus of claim 12, wherein the processing unit is configured for computing geometry-free, also called "ionospheric", pseudorange and carrier phase combinations based on the raw observations to cancel out the effects of the satellite motion relative to the reference stations, the effects of the clocks, and the effects of the troposphere; and using another information source to cancel out the effects of the ionosphere.

17. Apparatus of claim 16, wherein the other information source used to cancel out the effects of the ionosphere is an ionospheric map.

18. Apparatus of claim 12, wherein the generating unit is configured for generating satellite-specific-nadir-angle-dependent-correction-information comprises generating at least one calibration table to be sent to a plurality of NSS receivers.

19. Apparatus of claim 12, wherein the generating unit is configured for generating satellite-specific-nadir-angle-dependent-correction-information comprises generating coefficients for a polynomial expression, wherein the coefficients are to be sent to a plurality of NSS receivers.

20. Apparatus configured for generating correction information for use by a global or regional navigation satellite system receiver, hereinafter abbreviated as NSS receiver, to determine a position of the NSS receiver, the correction information hereinafter referred to as "satellite-specific-nadir-angle-dependent-correction-information", the satellite-specific-nadir-angle-dependent-correction-information associated with each of at least two navigation satellite system (NSS) satellites among a plurality of NSS satellites, wherein the satellite-specific-nadir-angle-dependent-correction-information associated with a NSS satellite comprises correction information depending on the nadir angle of a receiver as seen from the NSS satellite, so as to mitigate effects of satellite-specific, nadir-angle dependent biases in the NSS signals from the NSS satellite, the apparatus comprising:
a first unit, hereinafter referred to as "receiving unit", configured for, for each NSS satellite among the at least two NSS satellites, receiving raw observations obtained by observing NSS signals from the NSS satellite from a plurality of reference stations;

a second unit, hereinafter referred to as "processing unit", configured for, for each NSS satellite among the at least two NSS satellites, computing combination values based on the raw observations to cancel out effects of satellite motion relative to the reference stations, effects of clocks, effects of troposphere and effects of ionosphere, wherein the processing unit comprises:

- a first sub-unit, hereinafter referred to as "assigning sub-unit", configured for assigning the computed combination values into a plurality of nadir angle ranges, each nadir angle range being hereinafter referred to as an "angle bin";
- a second sub-unit, hereinafter referred to as "selecting sub-unit", configured for selecting a reference angle bin among the angle bins;
- a third sub-unit, hereinafter referred to as "first generating sub-unit", configured for generating, for each angle bin, a mean combination value by taking the average of all the computed combination values that are associated with nadir angles that fall within said angle bin, wherein the mean combination value generated for the reference angle bin is a satellite-specific reference value that is constant over all nadir angles;
- a fourth sub-unit, hereinafter referred to as "normalizing sub-unit", configured for normalizing, for each angle bin, the mean combination value generated for the angle bin, by subtracting the mean combination value generated for the reference angle bin from the mean combination value generated for the angle bin, to generate a normalized mean combination value for each angle bin; and
- a fifth sub-unit, hereinafter referred to as "second generating sub-unit", configured for generating correction information based on the normalized mean combination values;

a third unit, hereinafter referred to as "sending unit", configured for, for each NSS satellite among the at least two NSS satellites, sending the correction information to the NSS receiver for use in determining the position of the NSS receiver.

* * * * *